United States Patent
Takase

(10) Patent No.: US 9,887,689 B2
(45) Date of Patent: Feb. 6, 2018

(54) PSEUDO RESISTANCE CIRCUIT AND CHARGE DETECTION CIRCUIT

(71) Applicant: Murata Manufacturing Co., Ltd., Nagaokakyo-shi, Kyoto-fu (JP)

(72) Inventor: Yasuhide Takase, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/353,753

(22) Filed: Nov. 17, 2016

(65) Prior Publication Data

US 2017/0070209 A1 Mar. 9, 2017

Related U.S. Application Data

(63) Continuation of application No. PCT/JP2015/063763, filed on May 13, 2015.

(30) Foreign Application Priority Data

May 21, 2014 (JP) .................. 2014-105281

(51) Int. Cl.
*H03H 11/46* (2006.01)
*H01L 21/822* (2006.01)
(Continued)

(52) U.S. Cl.
CPC ........... *H03H 11/53* (2013.01); *H01L 21/822* (2013.01); *H01L 27/04* (2013.01);
(Continued)

(58) Field of Classification Search
CPC ........ H03H 11/46; H03H 11/52; H03H 11/53; H03F 3/45475
See application file for complete search history.

(56) References Cited

U.S. PATENT DOCUMENTS

| 4,868,482 A | 9/1989 | O'Shaughnessy et al. |
| 5,585,741 A | 12/1996 | Jordan |

(Continued)

FOREIGN PATENT DOCUMENTS

| JP | 60-167513 A | 8/1985 |
| JP | 10-502471 A | 3/1998 |

(Continued)

OTHER PUBLICATIONS

Official Communication issued in corresponding International Application PCT/JP2015/063763, dated Jun. 30, 2015.

*Primary Examiner* — Patrick O'Neill
(74) *Attorney, Agent, or Firm* — Keating & Bennett, LLP

(57) ABSTRACT

A pseudo resistance circuit includes a first gate voltage adjustment circuit that adjusts respective currents of first and second current sources and also adjusts a gate voltage of a second field effect transistor to equalize or substantially equalize a drain voltage of the second field effect transistor and a voltage of a first end portion of a reference resistance element and controls a drain voltage of a first field effect transistor and the drain voltage of the second field effect transistor to maintain a constant or substantially constant relationship with each other; and a second gate voltage adjustment circuit that adjusts a gate voltage of the first field effect transistor to control the gate voltage of the second field effect transistor and the gate voltage of the first field effect transistor to maintain a constant or substantially constant relationship with each other.

15 Claims, 13 Drawing Sheets

(51) Int. Cl.
*H01L 27/04* (2006.01)
*H03F 3/45* (2006.01)

(52) U.S. Cl.
CPC .............. *H03F 3/45475* (2013.01); *H03F 2203/45511* (2013.01); *H03F 2203/45512* (2013.01)

(56) References Cited

U.S. PATENT DOCUMENTS

| | | | | |
|---|---|---|---|---|
| 7,339,384 B2 * | 3/2008 | Peng | ........................ | G01D 5/24 324/658 |
| 8,054,156 B2 * | 11/2011 | Fort | ........................ | H01C 7/06 323/313 |
| 8,441,297 B2 * | 5/2013 | Jang | ........................ | H03H 11/53 327/308 |
| 9,660,592 B2 * | 5/2017 | Takase | ................... | G01R 29/24 |

FOREIGN PATENT DOCUMENTS

| | | |
|---|---|---|
| JP | 2006-080993 A | 3/2006 |
| JP | 2008-224230 A | 9/2008 |
| WO | 95/25349 A1 | 9/1995 |

* cited by examiner

PSEUDO RESISTANCE CIRCUIT AND CHARGE DETECTION CIRCUIT

CROSS REFERENCE TO RELATED APPLICATIONS

This application claims the benefit of priority to Japanese Patent Application No. 2014-105281 filed May 21, 2014 and is a Continuation Application of PCT Application No. PCT/JP2015/063763 filed on May 13, 2015. The entire contents of each application are hereby incorporated herein by reference.

BACKGROUND OF THE INVENTION

1. Field of the Invention

The present invention relates to pseudo resistance circuits and charge detection circuits, and particularly relate to a pseudo resistance circuit including a MOSFET (Metal-Oxide-Semiconductor Field-Effect Transistor) that is included in a weak inversion region and a charge detection circuit including the pseudo resistance circuit.

2. Description of the Related Art

Recently, charge output sensors of charge generation type such as a strain gauge, an acceleration sensor, and the like using an insulator piezoelectric element have been used. Because such a charge output sensor detects a tiny amount of charge, an amplification circuit for amplifying the detection signal is needed.

Further, with semiconductor devices of today having highly sophisticated functions and being highly integrated, a resistance element with a resistance value on the order of giga-ohms is needed in the semiconductor devices.

Under the situations discussed above, Japanese Unexamined Patent Application Publication No. 2008-224230, which relates to a detection device, a sensor, and an electronic apparatus, discloses an amplification circuit including an operational amplifier whose non-inverting input terminal is grounded, and a resistance element and a capacitor that are electrically connected in parallel between an output terminal and an inverting input terminal of the operational amplifier.

International Publication No. 1995/25349, which relates to a giga-ohm load resistance for a microelectronic integrated circuit, discloses a technique for obtaining a high resistance element by using a MOSFET in a weak inversion region.

However, according to research conducted by the inventor of the present invention, in a charge detection circuit, there are many cases where a frequency range of a detection signal from a charge output sensor develops even to a low frequency region. In such a case, it has previously been necessary to provide a high resistance element of at least no less than tens of mega-ohms in order to lower the cutoff frequency that is defined by a resistance value of a resistance element and capacitance of a capacitor.

With the configuration disclosed in Japanese Unexamined Patent Application Publication No. 2008-224230, if a high resistance element of no less than tens of mega-ohms is provided, the circuit configuration itself is caused to be large. Japanese Unexamined Patent Application Publication No. 2008-224230 does not disclose or implicitly describe, in any way, a specific configuration in which the circuit configuration is miniaturized and integrated.

Meanwhile, regarding the configuration disclosed in International Publication No. 1995/25349, although it is disclosed to obtain a high resistance element by using a MOSFET in a weak inversion region, International Publication No. 1995/25349 does not disclose or implicitly describe, in any way, a specific configuration showing how to apply the high resistance element to a charge detection circuit.

Further, according to the research conducted by the inventor of the present invention, because a resistance value of a MOSFET in a weak inversion region changes exponentially in accordance with factors such as an oxide film capacitance of the MOSFET, a threshold voltage, a temperature, and the like, the resistance value is extremely susceptible to a variation in processing in a sequence of the MOSFET manufacturing processes, and changes in a power source voltage and a temperature. In addition, the resistance value of the MOSFET in the weak inversion region changes exponentially in accordance with not only a change in a gate voltage but also with changes in drain and source voltages.

As such, in the case where a MOSFET is operated in a weak inversion region and is applied as a pseudo resistance element to a charge detection circuit, an adjustment circuit for the gate voltage is additionally required to adjust a resistance value of the MOSFET, that is, a pseudo resistance. Further, because the pseudo resistance changes when a voltage between the drain and the source of the MOSFET changes, the MOSFET exhibits excessively nonlinear characteristics as a resistance element and, therefore, it waveform distortion is generated in its output signal with a change in the power source voltage, or the like.

SUMMARY OF THE INVENTION

Preferred embodiments of the present invention provide a pseudo resistance circuit and a charge detection circuit including the pseudo resistance circuit, in which it is not necessary to include an additional adjustment circuit that adjusts a pseudo resistance of a field effect transistor, and which reduces waveform distortion due to a change in power source voltage of the field effect transistor.

According to a preferred embodiment of the present invention, a pseudo resistance circuit includes a first current source; a second current source; a first field effect transistor that operates in a weak inversion region; a second field effect transistor including electrical characteristics matched or substantially matched to electrical characteristics of the first field effect transistor, a source terminal electrically connected to a reference voltage terminal, and a drain terminal electrically connected to the first current source; a reference resistance element including a first end portion electrically connected to the reference voltage terminal and a second end portion electrically connected to the second current source; a first gate voltage adjustment circuit that adjusts a current of the first current source and a current of the second current source and also adjusts a gate voltage of the second field effect transistor so as to equalize or substantially equalize a drain voltage of the second field effect transistor and a voltage of the second end portion of the reference resistance element and controls a drain voltage of the first field effect transistor and the drain voltage of the second field effect transistor to maintain a constant or substantially constant relationship with each other; and a second gate voltage adjustment circuit that adjusts a gate voltage of the first field effect transistor to control the gate voltage of the first field effect transistor and the gate voltage of the second field effect transistor to maintain a constant or substantially constant relationship with each other.

The first gate voltage adjustment circuit adjusts a current of the first current source and a current of the second current source and also adjusts the gate voltage of the second field effect transistor to equalize or substantially equalize the drain voltage of the second field effect transistor and the voltage of the second end portion of the reference resistance element and controls the drain voltage of the first field effect transistor and the drain voltage of the second field effect transistor to maintain a constant or substantially constant relationship with each other, during which the second gate voltage adjustment circuit adjusts the gate voltage of the first field effect transistor to control the gate voltage of the first field effect transistor and the gate voltage of the second field effect transistor to maintain a constant or substantially constant relationship with each other, and a pseudo resistance of the first field effect transistor is stabilized at or substantially at a predetermined value.

According to a preferred embodiment of the present invention, the first gate voltage adjustment circuit includes a first voltage source that provides a constant or substantially constant potential difference to the drain voltage of the first field effect transistor and the drain voltage of the second field effect transistor as well as the voltage of the second end portion of the reference resistance element.

The first voltage source provides a constant or substantially constant potential difference to the drain voltage of the first field effect transistor and the drain voltage of the second field effect transistor as well as the voltage of the second end portion of the reference resistance element, and, even if the drain voltage of the first field effect transistor fluctuates to a positive or negative side, the influence of the fluctuation is removed and the pseudo resistance of the first field effect transistor is stably maintained at or substantially at a predetermined value.

According to a preferred embodiment of the present invention, the second gate voltage adjustment circuit includes a second voltage source that provides a constant or substantially constant potential difference to the gate voltage of the first field effect transistor and the gate voltage of the second field effect transistor.

The second voltage source of a predetermined voltage is provided in the electric wiring electrically connecting the gate terminal of the first field effect transistor and the gate terminal of the second field effect transistor, thereby adjusting the gate voltage of the first field effect transistor to lower the gate voltage according to the voltage of the second voltage source, and adjusting the pseudo resistance of the first field effect transistor to a higher value.

According to a preferred embodiment of the present invention, the first voltage source and the second voltage source each include a PTAT current source and a resistance element.

The first voltage source and the second voltage source are floating voltage sources including the PTAT current source and the resistance element. Temperature dependence of the pseudo resistance of the first field effect transistor due to influence of the drain voltage is offset or substantially offset, and the pseudo resistance of the first field effect transistor is adjustable and its temperature dependence is reduced.

According to a preferred embodiment of the present invention, the first gate voltage adjustment circuit includes a first operational amplifier and a second operational amplifier; a voltage adjusted by the first gate voltage adjustment circuit to maintain a constant or substantially constant relationship with the drain voltage of the first field effect transistor and the voltage of the second end terminal of the reference resistance element are respectively input to two input terminals of the first operational amplifier; an output terminal of the first operational amplifier provides a voltage that controls respective current supply operations of the first current source and the second current source to the first current source and the second current source; the voltage of the second end terminal of the reference resistance element and the drain voltage of the second field effect transistor are respectively input to two input terminals of the second operational amplifier; and an output terminal of the second operational amplifier provides the gate voltage to the gate terminal of the second field effect transistor.

The first operational amplifier controls respective current supply operations of the first current source and the second current source, during which the second operational amplifier performs negative feedback operation, and the pseudo resistance of the first field effect transistor is stabilized at or substantially at a predetermined value.

According to a preferred embodiment of the present invention, the first gate voltage adjustment circuit includes a first operational amplifier and a second operational amplifier; a voltage adjusted by the first gate voltage adjustment circuit to maintain a constant or substantially constant relationship with the drain voltage of the first field effect transistor, and the voltage of the second end terminal of the reference resistance element are respectively input to two input terminals of the first operational amplifier; an output terminal of the first operational amplifier provides a voltage that controls respective current supply operations of the first current source and the second current source to the first current source and the second current source; the voltage adjusted by the first gate voltage adjustment circuit to maintain a constant or substantially constant relationship with the drain voltage of the first field effect transistor and the drain voltage of the second field effect transistor are respectively input to two input terminals of the second operational amplifier; and an output terminal of the second operational amplifier provides the gate voltage to the gate terminal of the second field effect transistor.

The first operational amplifier controls the respective current operations of the first current source and the second current source, during which the second operational amplifier performs negative feedback operation, and the pseudo resistance of the first field effect transistor is stabilized at or substantially at a predetermined value.

According to a preferred embodiment of the present invention, a charge detection circuit includes the pseudo resistance circuit as described above; a third operational amplifier including an inverting input terminal electrically connected to the source terminal of the first field effect transistor, a non-inverting input terminal to which a reference voltage is input, and an output terminal electrically connected to the drain terminal of the first field effect transistor; and a capacitor electrically connected between the inverting input terminal of the third operational amplifier and the output terminal of the third operational amplifier and between the source terminal of the first field effect transistor and the drain terminal of the first field effect transistor.

In cooperation with the operation of the pseudo resistance circuit as described above, waveform distortion caused by nonlinearity of the pseudo resistance circuit is reduced in an output signal of the charge detection circuit. In addition, since the pseudo resistance of the first field effect transistor is relatively high, a detection signal in a low frequency region from a charge output senor is also amplified in the third operational amplifier with certainty and is output from the charge detection circuit.

As described above, the pseudo resistance circuit includes the first field effect transistor that operates in a weak inversion region; the second field effect transistor including electrical characteristics matched or substantially matched to electrical characteristics of the first field effect transistor, the source terminal electrically connected to the reference voltage terminal, and the drain terminal electrically connected to the first current source; the reference resistance element including the first end portion electrically connected to the reference voltage terminal and the second end portion electrically connected to the second current source; the first gate voltage adjustment circuit that adjusts the current of the first current source and the current of the second current source and also adjusts the gate voltage of the second field effect transistor, to equalize or substantially equalize the drain voltage of the second field effect transistor and the voltage of the second end portion of the reference resistance element and to control the drain voltage of the first field effect transistor and the drain voltage of the second field effect transistor to maintain a constant or substantially constant relationship with each other; and the second gate voltage adjustment circuit that adjusts the gate voltage of the first field effect transistor to control the gate voltage of the first field effect transistor and the gate voltage of the second field effect transistor to maintain a constant or substantially constant relationship with each other. Accordingly, it is not necessary to include an additional adjustment circuit that separately adjusts the pseudo resistance of the first field effect transistor, and it is possible to stabilize the pseudo resistance of the first field effect transistor to a predetermined value.

The first voltage source preferably provides a constant or substantially constant potential difference to the drain voltage of the first field effect transistor and the drain voltage of the second field effect transistor as well as the voltage of the second end portion of the reference resistance element, and, even if the drain voltage of the first field effect transistor fluctuates to a positive or negative side, the pseudo resistance of the first field effect transistor is stably maintained at or substantially at a predetermined value.

The second voltage source of a predetermined voltage is preferably provided in the electric wiring electrically connecting the gate terminal of the first field effect transistor and the gate terminal of the second field effect transistor, and the pseudo resistance of the first field effect transistor is adjusted according to the second voltage source.

Preferably, the first voltage source and the second voltage source are a floating voltage source including the PTAT current source and the resistance element, and the temperature dependence of the pseudo resistance of the first field effect transistor is offset or substantially offset. Accordingly, the pseudo resistance of the first field effect transistor is adjustable and its temperature dependence is reduced.

Preferably, the voltage that maintains a constant or substantially constant relationship with the drain voltage of the first field effect transistor, and the voltage of the second end terminal of the reference resistance element are respectively input to the two input terminals of the first operational amplifier; the output terminal of the first operational amplifier inputs the voltage that controls respective current supply operations of the first current source and the second current source to the first current source and the second current source; the voltage of the second end terminal of the reference resistance element and the drain voltage of the second field effect transistor are respectively input to the two input terminals of the second operational amplifier; and the output terminal of the second operational amplifier inputs the gate voltage to the gate terminal of the second field effect transistor, and the second operational amplifier performs the negative feedback operation while the first operational amplifier controlling the respective current supply operations of the first current source and the second current source. The pseudo resistance of the first field effect transistor is stabilized at or substantially at a predetermined value.

Preferably, the voltage that maintains a constant or substantially constant relationship with the drain voltage of the first field effect transistor, and the voltage of the second end terminal of the reference resistance element are respectively input to the two input terminals of the first operational amplifier; the output terminal of the first operational amplifier inputs the voltage that controls the respective current supply operations of the first current source and the second current source to the first current source and the second current source; the voltage that maintains a constant or substantially constant relationship with the drain voltage of the first field effect transistor, and the drain voltage of the second field effect transistor are respectively input to the two input terminals of the second operational amplifier; and the output terminal of the second operational amplifier inputs the gate voltage to the gate terminal of the second field effect transistor, and the first gate voltage adjustment circuit includes the first operational amplifier and the second operational amplifier, and the second operational amplifier performs the negative feedback operation while the first operational amplifier controls the respective current supply operations of the first current source and the second current source. The pseudo resistance of the first field effect transistor is stabilized at or substantially at a predetermined value.

As described above, the charge detection circuit preferably includes the pseudo resistance circuit; the third operational amplifier including the inverting input terminal electrically connected to the source terminal of the first field effect transistor, the non-inverting input terminal to which the reference voltage is input, and the output terminal electrically connected to the drain terminal of the first field effect transistor; and the capacitor electrically connected between the inverting input terminal of the third operational amplifier and the output terminal of the third operational amplifier as well as between the source terminal of the first field effect transistor and the drain terminal of the first field effect transistor, and the output signal of the charge detection circuit in which waveform distortion caused by the nonlinearity of the pseudo resistance circuit is reduced is obtained in cooperation with the effect of the pseudo resistance circuit. Further, since the pseudo resistance of the first field effect transistor is able to be relatively high, the detection signal in a low frequency region from the charge output senor is able to also be amplified in the third operational amplifier with certainty and output from the charge detection circuit. In addition, the charge detection circuit including the pseudo resistance circuit is easily integrated.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified through descriptions of specific preferred embodiments and examples of the present invention with reference to the drawings.

It is to be noted that the preferred embodiments described in this specification are merely examples, and the configurations in the preferred embodiments are able to be partly replaced or combined between different preferred embodiments.

First, a pseudo resistance circuit 1 according to a preferred embodiment is described below with reference to FIG. 1.

Figure 1:
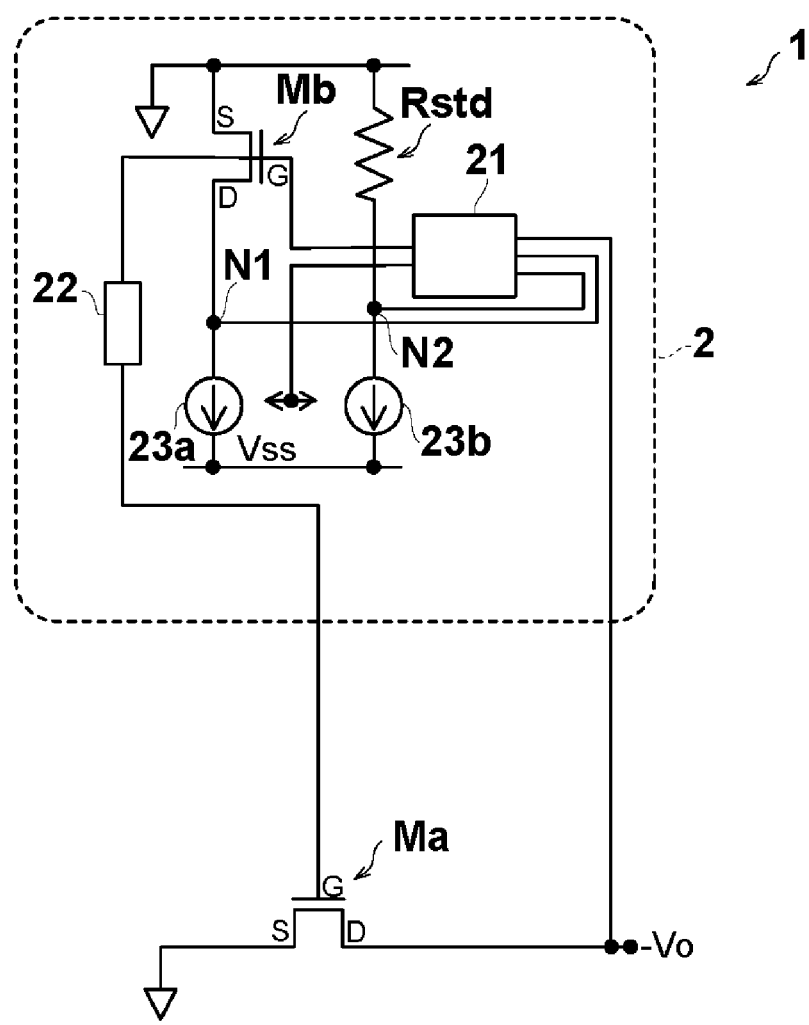
FIG. 1 is a circuit diagram illustrating a pseudo resistance circuit according to a preferred embodiment of the present invention.

FIG. 1 is a circuit diagram illustrating the pseudo resistance circuit 1.

As shown in FIG. 1, the pseudo resistance circuit 1 includes a first field effect transistor Ma and a distortion compensation bias source 2 that reduces waveform distortion due to a change in a resistance value of the first field effect transistor Ma.

The first field effect transistor Ma is a MOSFET, and, more specifically, is an n-type MOSFET. The first field effect transistor Ma functions as a pseudo resistance element when it is operated in a weak inversion region. In other words, a resistance value of the first field effect transistor Ma is a pseudo resistance in the weak inversion region.

A source terminal S of the first field effect transistor Ma is electrically connected to a reference voltage terminal, for example, a ground terminal, that supplies a reference voltage. A drain terminal D of the first field effect transistor Ma is a terminal whose voltage is a negative drain voltage Vo and is electrically connected to a first gate voltage adjustment circuit 21 in the distortion compensation bias source 2, details of which are explained below. A gate terminal G of the first field effect transistor Ma is electrically connected to a second gate voltage adjustment circuit 22 in the distortion compensation bias source 2 to be explained below.

The distortion compensation bias source 2 includes a second field effect transistor Mb, a reference resistance element Rstd, the first gate voltage adjustment circuit 21, the second gate voltage adjustment circuit 22, a first current source 23a, and a second current source 23b.

Electrical characteristics of the second field effect transistor Mb are matched or substantially matched to those of the first field effect transistor Ma. That is, the second field effect transistor Mb is generally manufactured, along with the first field effect transistor Ma, on the same wafer and in the same sequence of processes as a product including the same or similar solid state structure as the first field effect transistor Ma. In other words, a polarity of the second field effect transistor Mb is the same as a polarity of the first field effect transistor Ma. The second field effect transistor Mb is a MOSFET, and, more specifically, is an n-type MOSFET. Further, the second field effect transistor Mb, similar to the first field effect transistor Ma, is operated in a weak inversion region, and a resistance value of the second field effect transistor Mb is a pseudo resistance in the weak inversion region.

A source terminal S of the second field effect transistor Mb is electrically connected to a reference voltage terminal, for example, a ground terminal, that supplies a reference voltage. A drain terminal D of the second field effect transistor Mb is electrically connected to the first gate voltage adjustment circuit 21 and the first current source 23a. A gate terminal G of the second field effect transistor Mb is electrically connected to the first gate voltage adjustment circuit 21 and the second gate voltage adjustment circuit 22.

One end portion of the reference resistance element Rstd is electrically connected to the reference voltage terminal, for example, a ground terminal, that supplies the reference voltage, and the other end portion of the reference resistance element Rstd is electrically connected to the first gate voltage adjustment circuit 21 and the second current source 23b.

The first gate voltage adjustment circuit 21 adjusts a current of the first current source 23a and a current of the second current source 23b and also adjusts a gate voltage of the second field effect transistor Mb, to equalize or substantially equalize a drain voltage of the second field effect transistor Mb and a voltage of the other end portion of the reference resistance element Rstd and controls a drain voltage of the first field effect transistor Ma and the drain voltage of the second field effect transistor Mb to maintain a constant or substantially constant relationship with each other. Here, controlling the drain voltage of the first field effect transistor Ma, the drain voltage of the second field effect transistor Mb, and the voltage of the other end portion of the reference resistance element Rstd to maintain a constant or substantially constant relationship with each other includes controlling them to be equal or substantially equal to each other.

The second gate voltage adjustment circuit 22 adjusts a gate voltage of the first field effect transistor Ma to control the gate voltage of the first field effect transistor Ma and the gate voltage of the second field effect transistor Mb to maintain a constant or substantially constant relationship with each other. Here, controlling the gate voltage of the first field effect transistor Ma and the gate voltage of the second field effect transistor Mb to maintain a constant or substantially constant relationship with each other includes controlling them to be equal or substantially equal to each other.

In FIG. 1, a portion on the electric wiring electrically connecting the drain terminal D of the second field effect transistor Mb, the first gate voltage adjustment circuit 21, and the first current source 23*a* is indicated as a node N1. Further, a portion on the electric wiring electrically connecting the other end portion of the reference resistance element Rstd, the first gate voltage adjustment circuit 21, and the second current source 23*b* is indicated as a node N2.

Next, operation of the pseudo resistance circuit 1 is described below.

According to an example of conditions of the operation of the pseudo resistance circuit 1, a voltage of the gate terminal G of the first field effect transistor Ma and a voltage of the gate terminal G of the second field effect transistor Mb are higher than a predetermined value, that is, pseudo resistances thereof are lower than a predetermined value.

Under the conditions described above, the first gate voltage adjustment circuit 21, by equalizing or substantially equalizing a voltage of the node N1 and a voltage of the node N2 and controlling the drain voltage of the first field effect transistor Ma and the drain voltage of the second field effect transistor Mb to maintain a constant or substantially constant relationship with each other, adjusts the gate voltage of the second field effect transistor Mb through the first current source 23*a* and the second current source 23*b*. The second gate voltage adjustment circuit 22 adjusts the gate voltage of the first field effect transistor Ma to control the gate voltage of the first field effect transistor Ma and the gate voltage of the second field effect transistor Mb to maintain a constant or substantially constant relationship with each other. As a result, the gate voltage of the first field effect transistor Ma is controlled to a stable state at or substantially at a predetermined value. In the pseudo resistance circuit 1 including the features described above, the pseudo resistance of the first field effect transistor Ma is stable at or substantially at the predetermined value.

The pseudo resistance circuit 1 is able to be applied to charge detection circuits of specific examples, details of which are described below.

Specific examples of the pseudo resistance circuit 1 including the features described above and charge detection circuits including the pseudo resistance circuit are described below.

A first specific example of the pseudo resistance circuit 1 shown in FIG. 1 and a charge detection circuit including the pseudo resistance circuit are described below with reference to FIG. 2 and FIG. 3.

Figure 2:
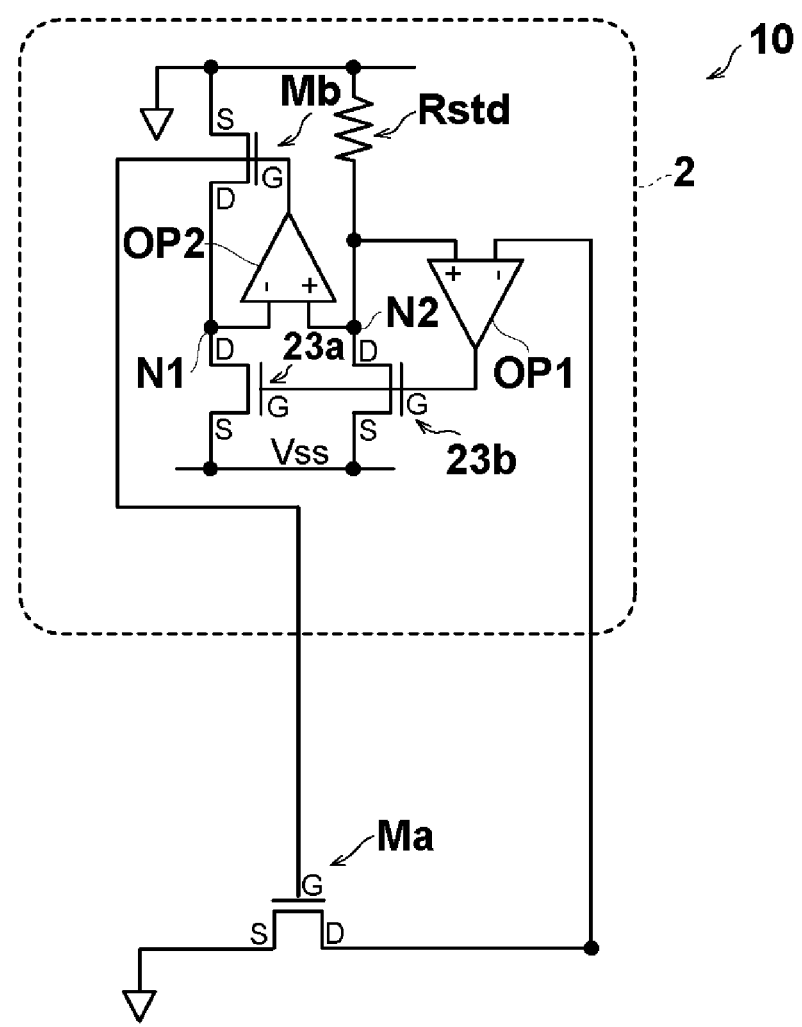
FIG. 2 is a circuit diagram illustrating a first specific example of the pseudo resistance circuit shown in FIG. 1.

FIG. 2 is a circuit diagram illustrating a pseudo resistance circuit in the first specific example.

With reference to FIG. 2, the features and operation of a pseudo resistance circuit 10 are described below.

As shown in FIG. 2, the pseudo resistance circuit 10 of the first specific example differs from the pseudo resistance circuit in FIG. 1 primarily in that the first gate voltage adjustment circuit 21 shown in FIG. 1 includes a first operational amplifier OP1, a second operational amplifier OP2, and electric wiring electrically connecting the first operational amplifier OP1 and the drain terminal D of the first field effect transistor Ma; the second gate voltage adjustment circuit 22 shown in FIG. 1 includes only electric wiring electrically connecting the gate terminal G of the first field effect transistor Ma and the gate terminal G of the second field effect transistor Mb; and the first current source 23*a* and the second current source 23*b* shown in FIG. 1 include field effect transistors, respectively. Other elements are the same as or similar to those in FIG. 1. In the first specific example, description is provided focusing on the different points discussed above, and the same reference signs are assigned to identical or similar elements and description thereof is simplified or omitted. The field effect transistors respectively defining the first current source 23*a* and the second current source 23*b* are considered to be operated in a strong inversion region.

A non-inverting input terminal (+) of the first operational amplifier OP1 is electrically connected to the other end portion of the reference resistance element Rstd, a non-inverting input terminal (+) of the second operational amplifier OP2, and a drain terminal D of the field effect transistor defining the second current source 23*b*. An inverting terminal (−) of the first operational amplifier OP1 is electrically connected to the drain terminal D of the first field effect transistor Ma only by electric wiring. That is, in the first specific example, the drain voltage of the first field effect transistor Ma and the drain voltage of the second field effect transistor Mb are equal or substantially equal to each other. Further, an output terminal of the first operational amplifier OP1 is electrically connected to each gate terminal G of the two field effect transistors respectively defining the first current source 23*a* and the second current source 23*b*.

A non-inverting input terminal (+) of the second operational amplifier OP2 is electrically connected to the other end portion of the reference resistance element Rstd, the non-inverting input terminal (+) of the first operational amplifier OP1, and to the drain terminal D of the field effect transistor defining the second current source 23*b*. An inverting input terminal (−) of the second operational amplifier OP2 is electrically connected to the drain terminal D of the second field effect transistor Mb and to a drain terminal D of the field effect transistor defining the first current source 23*a*. Further, an output terminal of the second operational amplifier OP2 is electrically connected to the gate terminal G of the second field effect transistor Mb.

Each source terminal S of the two field effect transistors defining the first current source 23*a* and the second current source 23*b* is electrically connected to a power source Vss. The first current source 23*a* and the second current source 23*b* may be defined by bipolar transistors.

The gate terminal G of the first field effect transistor Ma and the gate terminal G of the second field effect transistor Mb are electrically connected only by electric wiring. In other words, in the first specific example, gate voltages thereof are equal or substantially equal to each other.

In FIG. 2, a portion on the electric wiring electrically connecting the drain terminal D of the second field effect transistor Mb, the inverting input terminal (−) of the second operational amplifier OP2, and the first current source 23*a* is indicated as a node N1. A portion on the electric wiring electrically connecting the other end portion of the reference resistance element Rstd, the non-inverting input terminals (+) of the first operational amplifier OP1 and the second operational amplifier OP2, and the second current source 23*b* is indicated as a node N2.

Next, operation of the pseudo resistance circuit 10 is described below.

In the pseudo resistance circuit 10 including the features described above, the voltage of the gate terminal G of the first field effect transistor Ma and the voltage of the gate terminal G of the second field effect transistor Mb are higher than a predetermined value, that is, the pseudo resistances thereof are lower than a predetermined value, and the drain voltage Vo of the first field effect transistor Ma is a negative voltage. Operation of the pseudo resistance circuit 10 is discussed below with respect to the conditions described above.

Under the conditions described above, the voltage of the other end portion of the reference resistance element Rstd, that is, the voltage of the node N2 is input to the non-inverting input terminal (+) of the first operational amplifier OP1, and a negative voltage is input to the inverting input terminal (−) of the first operational amplifier OP1. In response to a change in the output voltage of the first operational amplifier OP1, the currents provided by the field effect transistors of the first current source 23a and the second current source 23b are changed through respective gate voltages of the transistors, and the voltage of the non-inverting input terminal (+) and the voltage of the inverting input terminal (−) of the first operational amplifier OP1 are accordingly controlled to be equal or substantially equal to each other. Currents flow between the reference voltage terminal, for example, a ground terminal, that supplies the reference voltage and the power source Vss while passing through the second field effect transistor Mb, the first current source 23a and the reference resistance element Rstd as well as the second current source 23b, and voltages are generated at the nodes N1 and N2 corresponding to these currents. At this time, the voltage of the node N1 includes a value reflecting the drain voltage of the drain terminal D of the second field effect transistor Mb, and the voltage of the node N2 includes a value reflecting the voltage of the other end portion of the reference resistance element Rstd.

The voltage of the node N2 is input to the non-inverting input terminal (+) and the voltage of the node N1 is input to the inverting input terminal (+) of the second operational amplifier OP2. In response to a drop in the output voltage of the second operational amplifier OP2 in accordance with a difference between the voltages of the nodes N1 and N2, the gate voltage of each of the first field effect transistor Ma and the second field effect transistor Mb drops by the same or substantially the same amount, and the pseudo resistance of each of the first field effect transistor Ma and the second field effect transistor Mb increases.

In addition, due to the negative feedback performed continuously by the second operational amplifier OP2, the difference between the voltages of the nodes N1 and N2 is gradually reduced. As a result, the gate voltage of the second field effect transistor Mb is decreased and controlled to a stable state at or substantially at a predetermined value, and the gate voltage of the first field effect transistor Ma is decreased accordingly and is controlled to a stable state at or substantially at a predetermine value.

In other words, due to the negative feedback operation of the second operational amplifier OP2, both the pseudo resistance of the second field effect transistor Mb and the pseudo resistance of the first field effect transistor Ma gradually become higher, and finally come to a stable state at or substantially at a predetermined value.

In the pseudo resistance circuit 10 as discussed above, the gate voltage of the second field effect transistor Mb is changed and stabilized to equalize or substantially equalize the drain voltage of the second field effect transistor Mb and the voltage of the other end portion of the reference resistance element Rstd and to maintain the drain voltage of the first field effect transistor Ma and the drain voltage of the drain terminal D of the second field effect transistor Mb to be equal or substantially equal to each other. Then, the gate voltage of the first field effect transistor Ma and the gate voltage of the second field effect transistor Mb are equal or substantially equal to each other, thereby maintaining the pseudo resistance of the first field effect transistor Ma to be stable at or substantially at the predetermined value.

Next, the features and operation of a charge detection circuit 100 including the pseudo resistance circuit 10 are described below with reference to FIG. 3.

Figure 3:
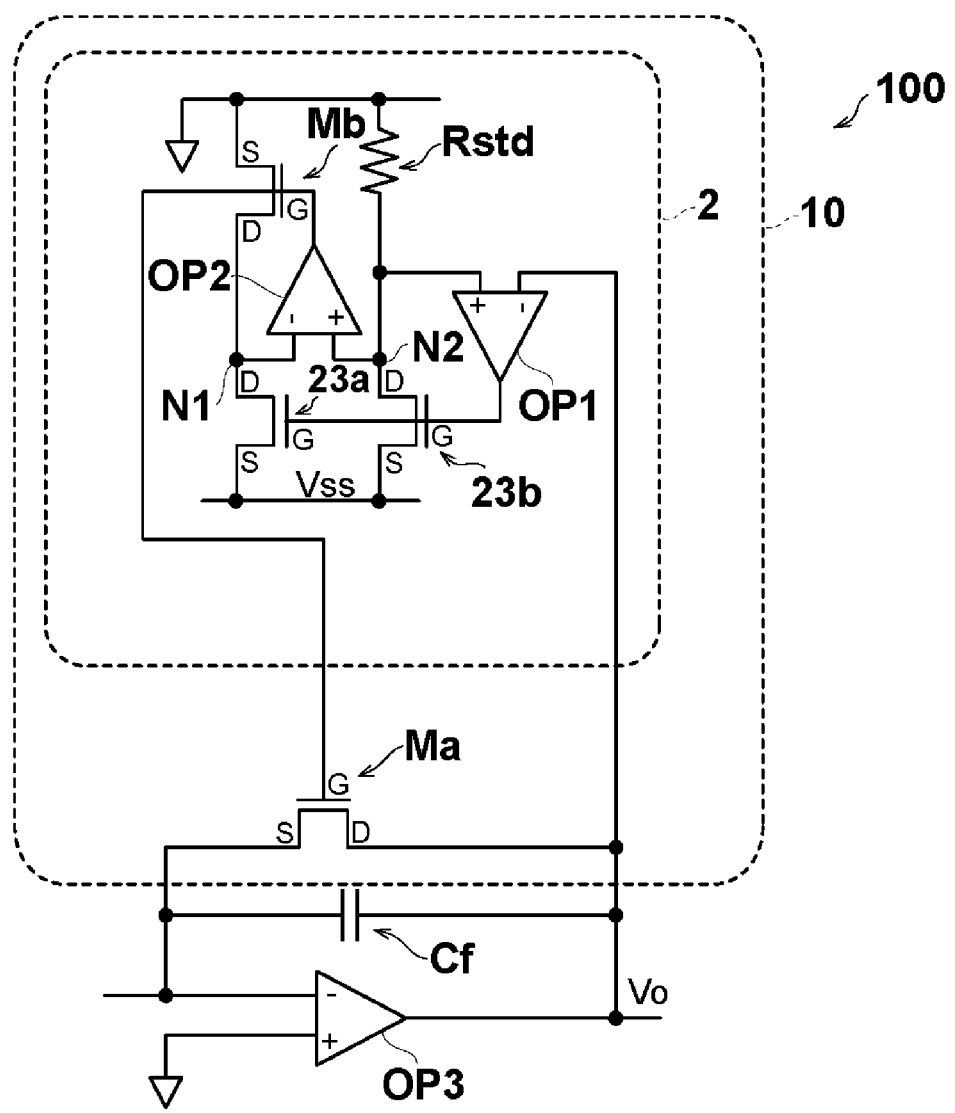
FIG. 3 is a circuit diagram illustrating a charge detection circuit including the first specific example of the pseudo resistance circuit shown in FIG. 2.

FIG. 3 is a circuit diagram illustrating the charge detection circuit 100 including the pseudo resistance circuit 10 of the first specific example.

As shown in FIG. 3, the charge detection circuit 100 includes the pseudo resistance circuit 10, a third operational amplifier OP3, and a capacitor Cf.

A non-inverting input terminal (+) of the third operational amplifier OP3 is electrically connected to a reference voltage terminal, for example, a ground terminal. An inverting input terminal (−) of the third operational amplifier OP3 is electrically connected to the source terminal S of the first field effect transistor Ma. An output terminal of the third operational amplifier OP3 is electrically connected to the drain terminal D of the first field effect transistor Ma. The capacitor Cf is electrically connected in parallel between the output terminal of the third operational amplifier OP3 and the inverting input terminal (−) thereof as well as between the source terminal S of the first field effect transistor Ma and the drain terminal D thereof.

In the charge detection circuit 100 as described above, a detection signal from a charge output sensor (not shown) is input to the inverting input terminal (−) of the third operational amplifier OP3, and the detection signal is output as an amplified signal.

According to the pseudo resistance circuit 10, because the pseudo resistance of the first field effect transistor Ma is stable at or substantially at a predetermined value, waveform distortion caused by nonlinearity of the pseudo resistance is reduced in the output signal of the charge detection circuit 100 output from the output terminal of the third operational amplifier OP3. In addition, because the pseudo resistance of the first field effect transistor Ma is able to be relatively high, a detection signal in a low frequency region from the charge output sensor is also amplified with certainty in the third operational amplifier OP3 and output from the charge detection circuit 100. Moreover, in the charge detection circuit 100 including the above-described pseudo resistance circuit 10, circuit integration is able to be easily implemented.

Next, a second specific example of the pseudo resistance circuit 1 shown in FIG. 1 and a charge detection circuit including the pseudo resistance circuit are described below.

Figure 4:
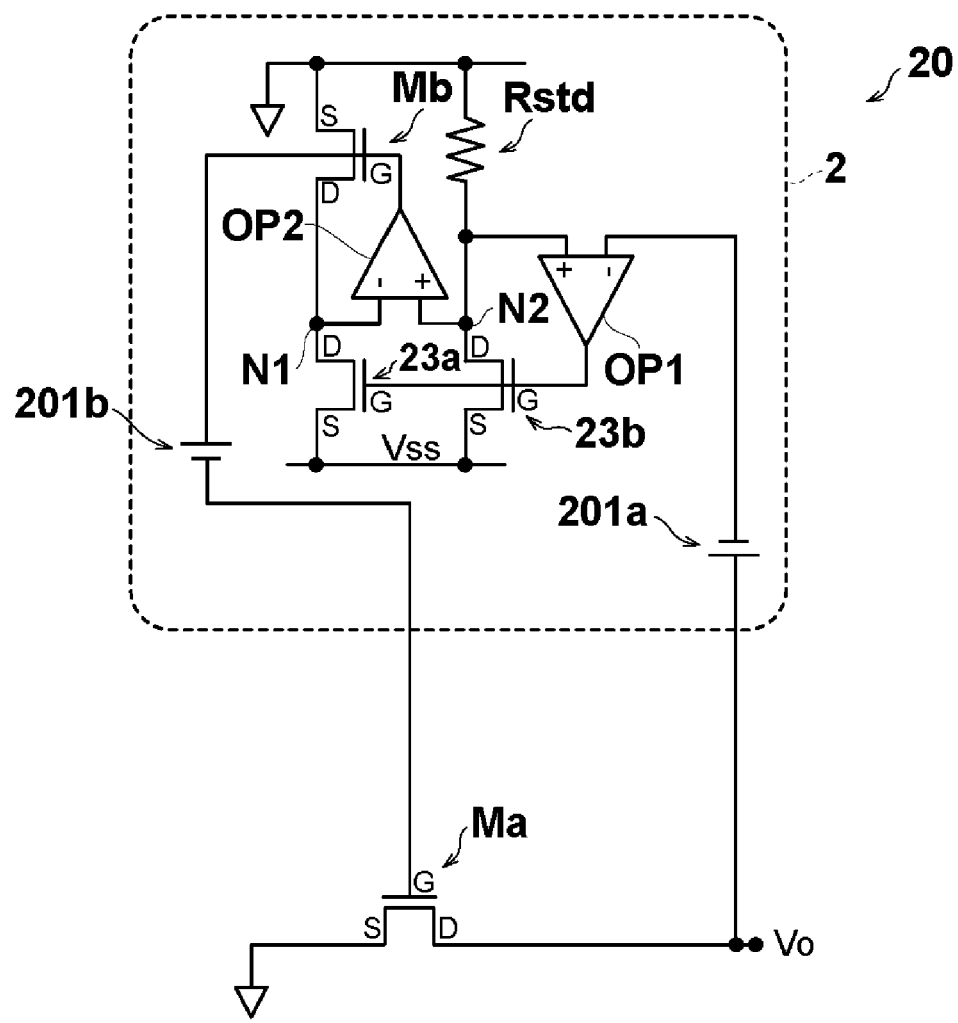
FIG. 4 is a circuit diagram illustrating a second specific example of the pseudo resistance circuit shown in FIG. 1.
Figure 5:
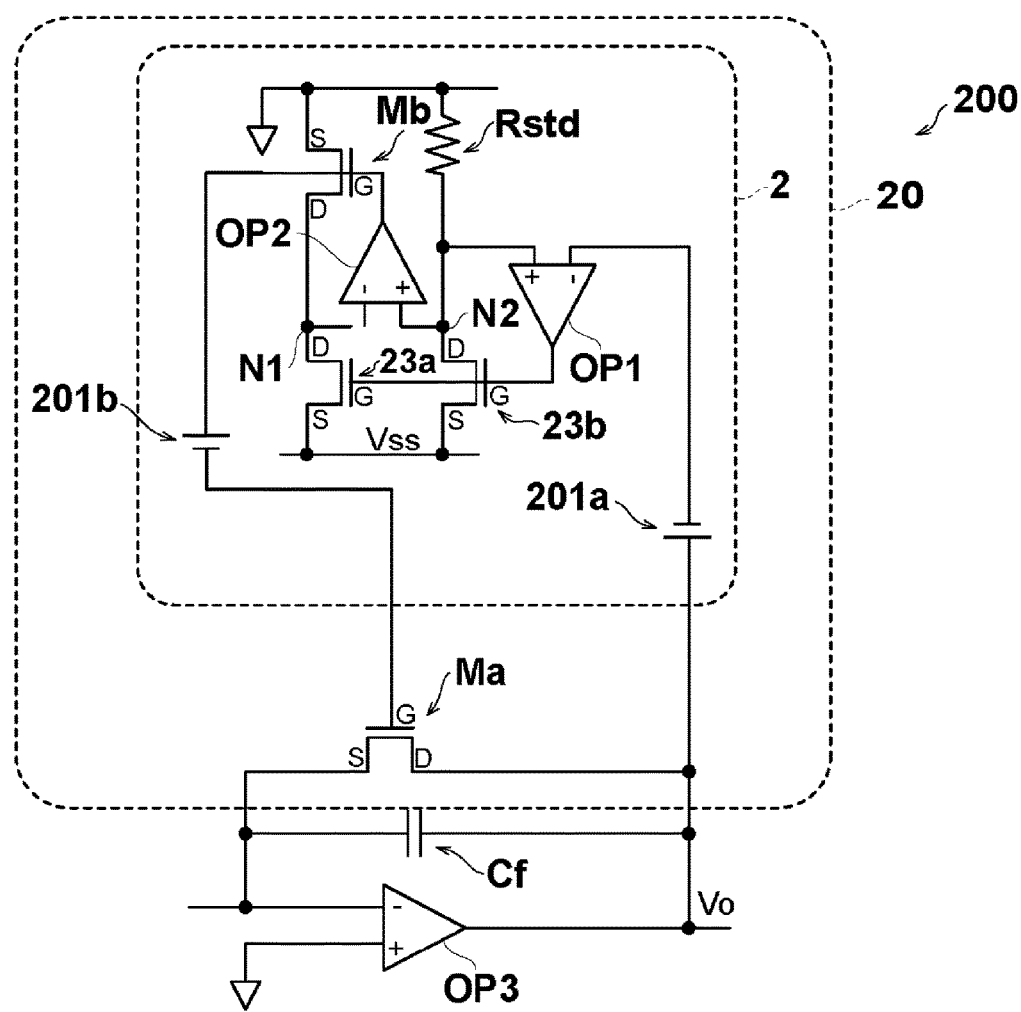
FIG. 5 is a circuit diagram illustrating a charge detection circuit including the second specific example of the pseudo resistance circuit shown in FIG. 4.

FIG. 4 is a circuit diagram illustrating a pseudo resistance circuit of the second specific example. FIG. 5 is a circuit diagram illustrating a charge detection circuit including the pseudo resistance circuit of the second specific example.

As shown in FIGS. 4 and 5, a pseudo resistance circuit and a charge detection circuit 200 of the second specific example differ from the pseudo resistance circuit and the charge detection circuit in FIGS. 2 and 3 primarily in that a DC voltage source 201a of a predetermined voltage is included as an element of the first gate voltage adjustment circuit 21 in the electric wiring connecting the drain terminal D of the first field effect transistor Ma and the inverting input terminal (−) of the first operational amplifier OP1 shown in FIGS. 2 and 3, and a DC voltage source 201b of a predetermined voltage is included as an element of the second gate voltage adjustment circuit 22 in the electric wiring connecting the gate terminal G of the first field effect transistor Ma and the gate terminal G of the second field effect transistor Mb shown in FIGS. 2 and 3. Other elements are the same as or similar to those in FIGS. 2 and 3. In the second specific example, description is provided focusing on the different points discussed above, and the same reference signs are assigned to identical or similar elements and description thereof is simplified or omitted.

The features and operation of the pseudo resistance circuit 20 of the second specific example are described below with reference to FIG. 4.

As shown in FIG. 4, according to the pseudo resistance circuit 20 of the second specific example, the DC voltage source 201a of a predetermined voltage is provided in the electric wiring connecting the drain terminal D of the first field effect transistor Ma and the inverting input terminal (−) of the first operational amplifier OP1, and the DC voltage source 201b of a predetermined voltage is provided in the electric wiring connecting the gate terminal G of the first field effect transistor Ma and the gate terminal G of the second field effect transistor Mb.

More specifically, a negative electrode terminal of the DC voltage source 201a is electrically connected to the inverting input terminal (−) of the first operational amplifier OP1, and a positive electrode terminal of the DC voltage source 201a is electrically connected to the drain terminal D of the first field effect transistor Ma. A negative electrode terminal of the DC voltage source 201b is electrically connected to the gate terminal G of the first field effect transistor Ma, and a positive electrode terminal of the DC voltage source 201b is electrically connected to the gate terminal G of the second field effect transistor Mb.

The DC voltage source 201a is provided in the pseudo resistance circuit 20 for at least the reasons described below.

If the drain voltage Vo of the first field effect transistor Ma does not include an assumed negative voltage but instead includes a positive voltage, the output voltage of the first operational amplifier OP1 drops, and the pseudo resistance circuit 20 attempts to increase the voltage of the node N2 by decreasing the current of the second current source 23b. However, the potential of the node N2 is raised only to the reference voltage. As a result, a state is reached where a negative feedback operation of the second operational amplifier OP2 cannot be performed.

In the pseudo resistance circuit 20, by providing the DC voltage source 201a, a voltage of a negative value similar to that in the first specific example is able to be supplied to the inverting input terminal (−) of the first operational amplifier OP1 even if the drain voltage Vo of the first field effect transistor Ma includes a positive value. The drain voltage of the drain terminal D of the second field effect transistor Mb becomes lower than the drain voltage of the first field effect transistor Ma. A voltage value Voff of the DC voltage source 201a is preferably set to a positive value greater than a maximum value Vmax of amplitude of the drain voltage Vo of the first field effect transistor Ma (Voff>Vmax).

Further, in the pseudo resistance circuit 20, by providing the above-described DC voltage source 201b, the gate voltage of the first field effect transistor Ma is able to be adjusted so as to be lower than the gate voltage of the second field effect transistor Mb according to the voltage of the DC voltage source, and the pseudo resistance of the first field effect transistor Ma is adjustable towards a higher value.

As a result, in the pseudo resistance circuit 20, by providing the DC voltage sources 201a and 201b as discussed above, similar to the pseudo resistance circuit 10 of the first specific example, if the drain voltage Vo of the first field effect transistor Ma includes a negative voltage, the pseudo resistance of the first field effect transistor Ma is stably maintained at or substantially at a predetermined value, and in addition, even if the drain voltage Vo of the first field effect transistor Ma changes and includes a positive voltage, the pseudo resistance is maintained at or substantially at the predetermined value and, further, the pseudo resistance of the first field effect transistor Ma is adjustable towards a higher value. However, only one of the DC voltage sources 201a and 201b may be included in the pseudo resistance circuit 20.

Next, the features and operation of a charge detection circuit 200 including the pseudo resistance circuit 20 are described below with reference to FIG. 5.

As shown in FIG. 5, the charge detection circuit 200 of the second specific example includes, in addition to the pseudo resistance circuit 20, the third operational amplifier OP3 and the capacitor Cf, similar to the charge detection circuit 100 of the first specific example.

In the pseudo resistance circuit 20 of the second specific example, by providing the DC voltage sources 201a and 201b, similar to the pseudo resistance circuit 10 of the first specific example, the pseudo resistance of the first field effect transistor Ma is stably maintained at or substantially at a predetermined value, and in addition, even if the drain voltage Vo of the first field effect transistor Ma changes and includes a positive voltage, the pseudo resistance of the first field effect transistor Ma is adjustable toward a higher value.

Accordingly, in the charge detection circuit 200 of the second specific example, waveform distortion caused by the nonlinearity of the pseudo resistance is reduced in the output signal of the charge detection circuit 200 output from the output terminal of the third operational amplifier OP3, similar to the charge detection circuit 100 of the first specific example, and in addition, even if the drain voltage Vo of the first field effect transistor Ma changes to a positive voltage, a detection signal in a lower frequency region from the charge output sensor is amplified in the third operational amplifier OP3 with certainty, in comparison with the charge detection circuit 100 of the first specific example, and is output from the charge detection circuit 200.

Next, a third specific example of the pseudo resistance circuit 1 shown in FIG. 1 and a charge detection circuit including the pseudo resistance circuit are described below.

Figure 6:
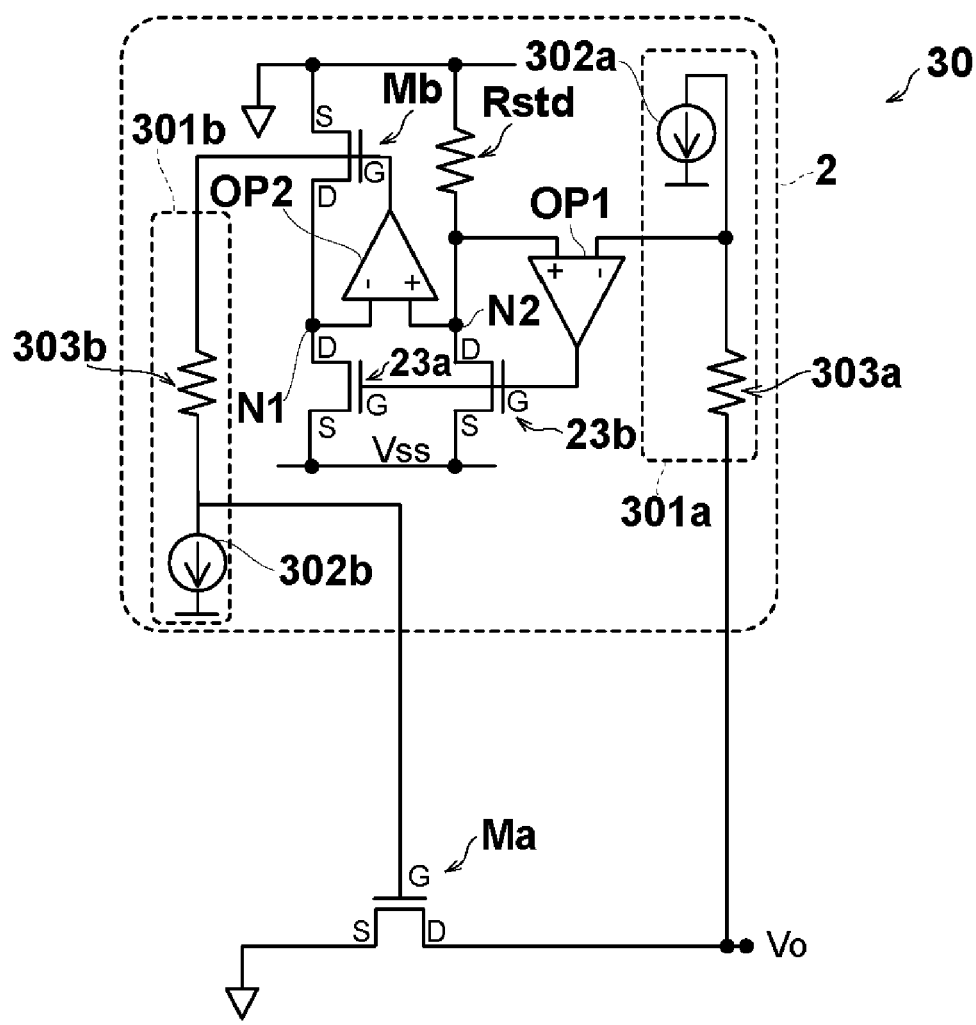
FIG. 6 is a circuit diagram illustrating a third specific example of the pseudo resistance circuit shown in FIG. 1.
Figure 7:
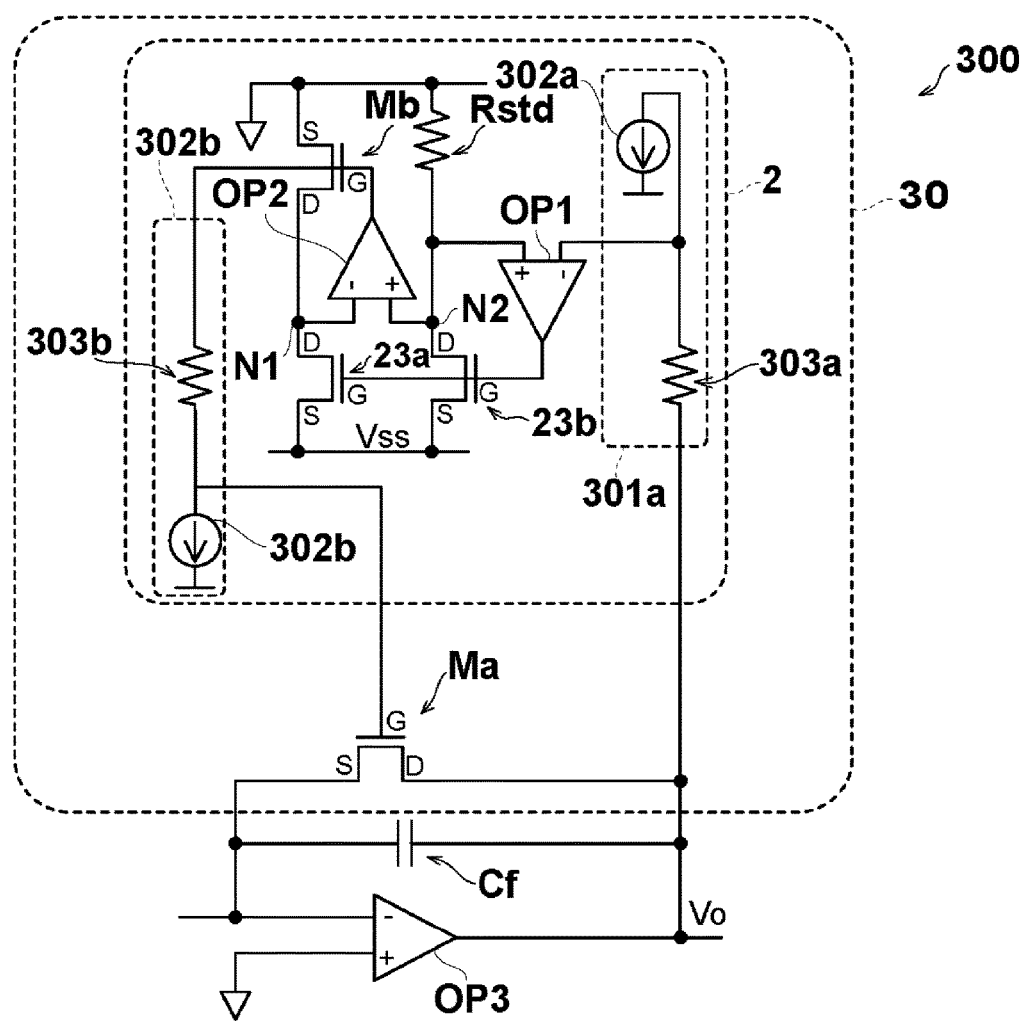
FIG. 7 is a circuit diagram illustrating a charge detection circuit including the third specific example of the pseudo resistance circuit shown in FIG. 6.

FIG. 6 is a circuit diagram illustrating a pseudo resistance circuit of the third specific example. FIG. 7 is a circuit diagram illustrating a charge detection circuit including the pseudo resistance circuit of the third specific example.

As shown in FIGS. 6 and 7, a pseudo resistance circuit 30 and a charge detection circuit 300 of the third specific example differ from the pseudo resistance circuit and the charge detection circuit in FIGS. 4 and 5 primarily in that the DC voltage sources 201a and 201b shown in FIGS. 4 and 5 are replaced with floating voltage sources 301a and 301b, respectively. Other elements are the same as or similar to those shown in FIGS. 4 and 5. In the third specific example, description is provided focusing on the different points discussed above, and the same reference signs are assigned to identical or similar elements and description thereof is simplified or omitted.

First, the features and operation of the pseudo resistance circuit 30 of the third specific example are described below with reference to FIG. 6.

As shown in FIG. 6, the pseudo resistance circuit 30 of the third specific example includes, instead of the DC voltage sources 201a and 201b in the pseudo resistance circuit 20 of the second specific example, the floating voltage sources 301a and 301b including a PTAT (Proportional To Absolute Temperature) current source 302a and a resistance element 303a, and a PTAT current source 302b and a resistance element 303b, respectively. A voltage value Voff of the floating voltage 301a, similar to the DC voltage source 201a of the second specific example, is preferably set to a positive value greater than the maximum value Vmax of the amplitude of the drain voltage Vo of the first field effect transistor Ma (Voff>Vmax).

More specifically, one terminal of the PTAT current source 302a is electrically connected to the inverting input terminal (−) of the first operational amplifier OP1 and one end portion of the resistance element 303a, and the other terminal of the PTAT current source 302a is electrically connected to a reference voltage terminal, for example, a ground terminal, that supplies a reference voltage. Further, the one end portion of the resistance element 303a is electrically connected to the one terminal of the PTAT current source 302a and the inverting input terminal (−) of the first operational amplifier OP1, while the other end portion of the resistance element 303a is electrically connected to the drain terminal D of the first field effect transistor Ma.

One terminal of the PTAT current source 302b is electrically connected to the gate terminal G of the first field effect transistor Ma and one end portion of the resistance element 303b, while the other terminal of the PTAT current source 302b is electrically connected to a reference voltage terminal, for example, a ground terminal, that supplies a reference voltage. Further, the one end portion of the resistance element 303b is electrically connected to the one terminal of the PTAT current source 302b and the gate terminal G of the first field effect transistor Ma, while the other end portion of the resistance element 303b is electrically connected to the gate terminal G of the second field effect transistor Mb.

In the pseudo resistance circuit 30 of the third specific example, by providing the floating voltage sources 301a and 301b, the gate voltage of the first field effect transistor Ma is able to be adjusted according to the output voltages that are proportional to the temperatures, and the pseudo resistance of the first field effect transistor Ma is adjustable to offset or substantially offset the temperature dependence of the pseudo resistance of the first field effect transistor Ma.

As a result, in the pseudo resistance circuit 30, by providing the floating voltage sources 301a and 301b as described above, even if the drain voltage Vo of the first field effect transistor Ma changes to a positive voltage, similar to the pseudo resistance circuit 20 of the second specific example, the pseudo resistance of the first field effect transistor Ma is adjustable towards a higher value, and further the pseudo resistance of the first field effect transistor Ma is adjustable to offset or substantially offset the temperature dependence of the pseudo resistance of the first field effect transistor Ma, thereby reducing the overall temperature dependence.

Next, the features and operation of the charge detection circuit 300 including the pseudo resistance circuit 30 are described below with reference to FIG. 7.

As shown in FIG. 7, the charge detection circuit 300 of the third specific example includes, in addition to the pseudo resistance circuit 30, the third operational amplifier OP3 and the capacitor Cf, similar to the charge detection circuit 200 of the second specific example.

In the pseudo resistance circuit 30, by providing the floating voltage sources 301a and 301b, even if the drain voltage Vo of the first field effect transistor Ma changes to a positive voltage, similar to the pseudo resistance circuit 20 of the second specific example, the pseudo resistance of the first field effect transistor Ma is adjustable towards a higher value, and the pseudo resistance of the first field effect transistor Ma is adjustable to offset or substantially offset the temperature dependence of the pseudo resistance of the first field effect transistor Ma, thereby reducing the overall temperature dependence.

Accordingly, in the charge detection circuit 300, similar to the charge detection circuit 200 of the second specific example, even if the drain voltage Vo of the first field effect transistor Ma changes to a positive voltage, an output signal of the charge detection circuit 300 output from the output terminal of the third operational amplifier OP3 is generated, and a detection signal in a lower frequency region from the charge output sensor is amplified in the third operational amplifier OP3 with certainty and output in a mode in which waveform distortion caused by the nonlinearity of the pseudo resistance is reduced, and further the temperature dependence thereof is reduced in comparison with the charge detection circuit 200 of the second specific example.

In the third specific example, one of the DC voltage sources 201a and 201b in the pseudo resistance circuit 20 of the second specific example may be replaced with the corresponding floating voltage source 301a or 301b.

Next, a fourth specific example of the pseudo resistance circuit 1 shown in FIG. 1 and a charge detection circuit including the pseudo resistance circuit are described below with reference to FIGS. 8 and 9.

Figure 8:
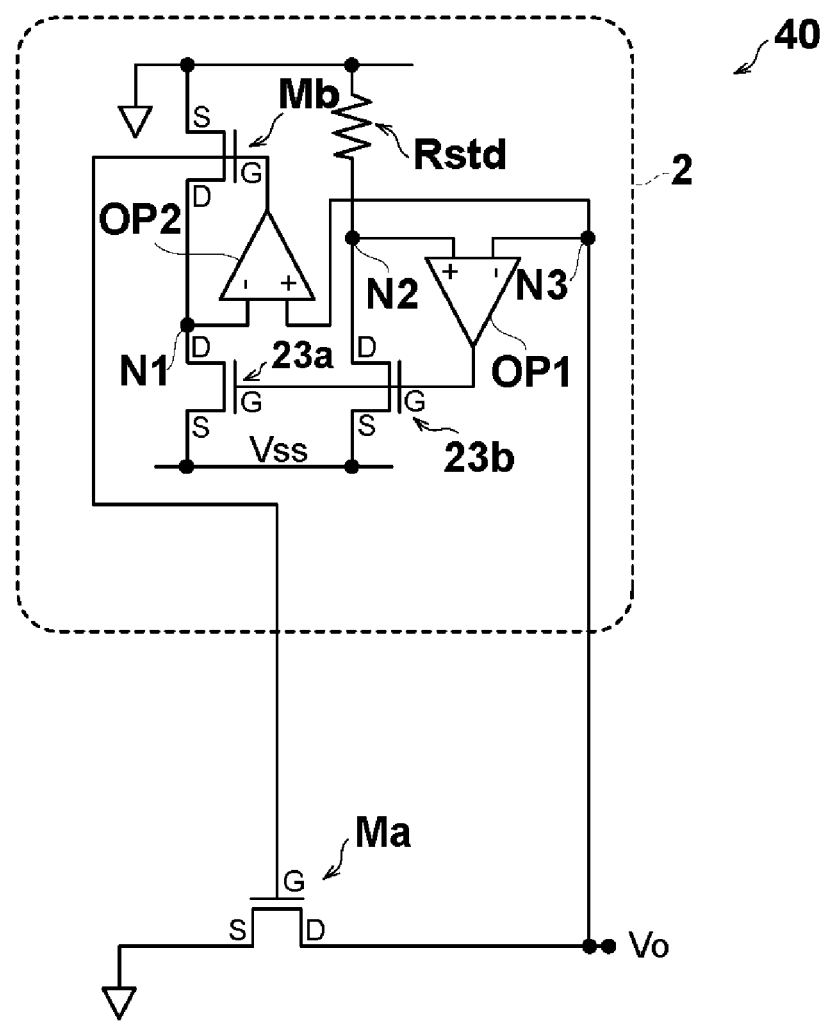
FIG. 8 is a circuit diagram illustrating a fourth specific example of the pseudo resistance circuit shown in FIG. 1.

FIG. 8 is a circuit diagram illustrating a pseudo resistance circuit of the fourth specific example.

Figure 9:
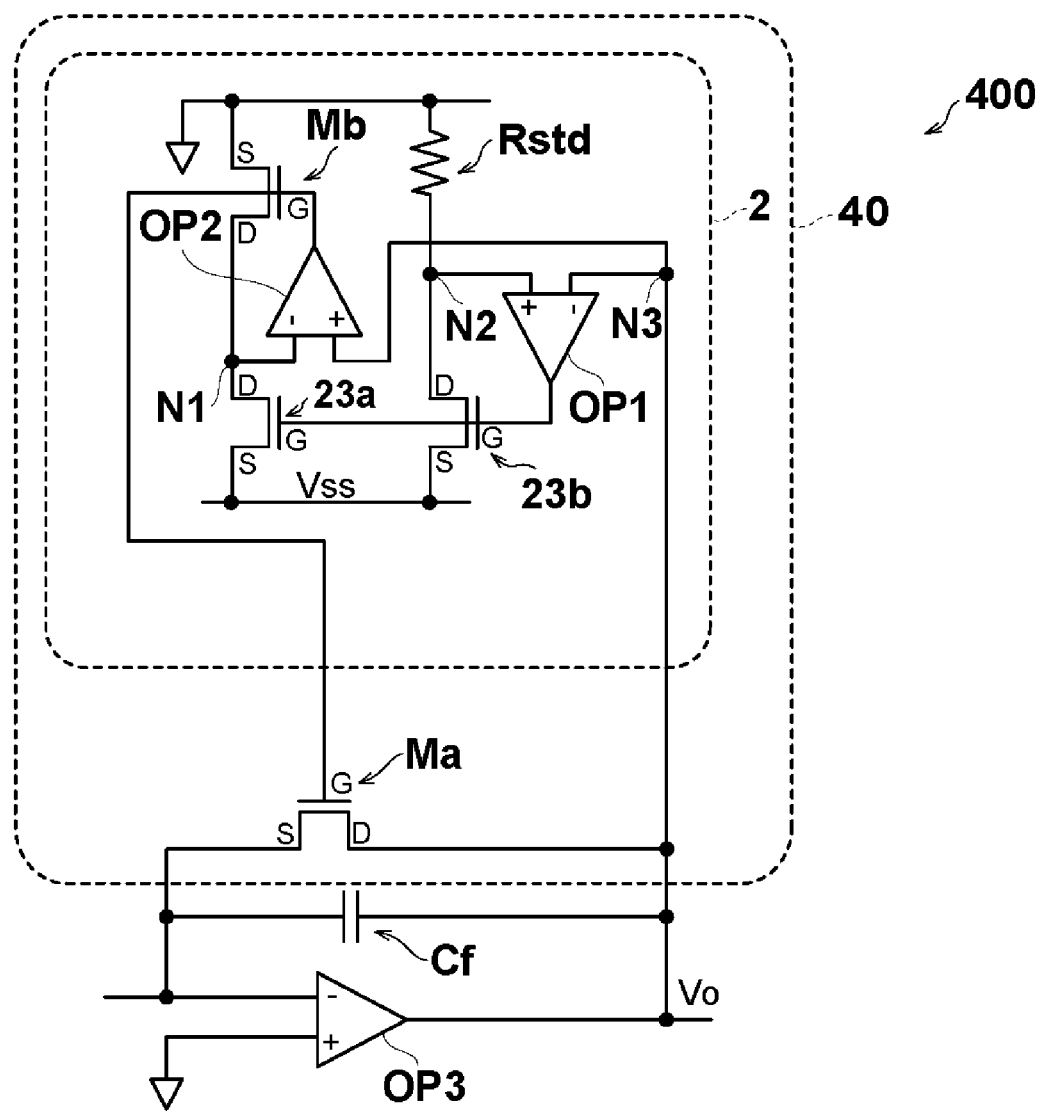
FIG. 9 is a circuit diagram illustrating a charge detection circuit including the fourth specific example of the pseudo resistance circuit shown in FIG. 8.

As shown in FIGS. 8 and 9, a pseudo resistance circuit 40 of the fourth specific example differs from the pseudo resistance circuit in FIGS. 2 and 3 primarily in that the non-inverting input terminal (+) of the second operational amplifier OP2 in the pseudo resistance circuit 10 of the first specific example shown in FIGS. 2 and 3 is connected to a node N3 on the electric wiring electrically connecting the drain terminal D of the first field effect transistor Ma and the inverting input terminal (−) of the first operational amplifier OP1. Other elements are the same as or similar to those in FIGS. 2 and 3. In the fourth specific example, description is provided focusing on the different points discussed above, and the same reference signs are assigned to identical or similar elements and description thereof is simplified or omitted.

In FIG. 8, a portion on the electric wiring electrically connecting the drain terminal of the second field effect transistor Mb, the inverting input terminal (−) of the second operational amplifier OP2, and the first current source 23a is indicated as a node N1. Further, a portion on the electric wiring electrically connecting the other end portion of the reference resistance element Rstd, the non-inverting input terminal (+) of the first operational amplifier OP1, and the second current source 23b is indicated as a node N2.

Next, operation of the pseudo resistance circuit 40 is described below.

According to an example of conditions of the operation of the pseudo resistance circuit 40, the voltage of the gate terminal G of the first field effect transistor Ma and the voltage of the gate terminal G of the second field effect transistor Mb are higher than a predetermined value, in other words, the pseudo resistances thereof are lower than a predetermined value, and the drain voltage Vo of the first field effect transistor Ma is a negative voltage.

Under the conditions described above, the voltage of the other end portion of the reference resistance element Rstd, that is, a voltage of the node N2 is input to the non-inverting input terminal (+) of the first operational amplifier OP1, and the drain voltage Vo of the first field effect transistor Ma, that is, a negative voltage of the node N3 is input to the inverting input terminal (−) of the first operational amplifier OP1.

Accordingly, an increase in the output voltage of the first operational amplifier OP1 changes the respective gate voltages of the field effect transistors defining the first current source 23a and the second current source 23b, the currents flowed by the transistors are changed, and the voltage of the non-inverting input terminal (+) and the voltage of the inverting input terminal (−) of the first operational amplifier OP1 are accordingly controlled to be equal or substantially equal to each other. Currents flow between the reference voltage terminal, for example, a ground terminal, that supplies the reference voltage and the power source Vss while passing through the second field effect transistor Mb, the first current source 23a and the reference resistance element Rstd as well as the second current source 23b, and voltages are generated at the nodes N1 and N2 corresponding to these currents. At this time, the voltage of the node N1 includes a value reflecting the drain voltage of the drain terminal D of the second field effect transistor Mb, and the voltage of the node N2 includes a value reflecting the voltage of the other end portion of the reference resistance element Rstd.

The voltage of the node N3 is input to the non-inverting input terminal (+) and the voltage of the node N1 is input to the inverting input terminal (+) of the second operational amplifier OP2. In response to a drop in the output voltage of the second operational amplifier OP2 in accordance with a difference between the voltages of the nodes N1 and N3, the gate voltage of each of the first field effect transistor Ma and the second field effect transistor Mb drops in the same or substantially the same amount, and the pseudo resistance of each of the first field effect transistor Ma and the second field effect transistor Mb increases.

In addition, due to the negative feedback performed continuously by the second operational amplifier OP2, the difference between the voltages of the nodes N1 and N3 is gradually reduced. As a result, the gate voltage of the second field effect transistor Mb is decreased and accordingly controlled to a stable state at or substantially at a predetermined value, and the gate voltage of the first field effect transistor Ma is decreased accordingly and controlled to a stable state at or substantially at a predetermine value.

In other words, due to the negative feedback operation of the second operational amplifier OP2, both of the pseudo resistance of the second field effect transistor Mb and the pseudo resistance of the first field effect transistor Ma gradually become higher, and finally become stable at or substantially at a predetermined value.

In the pseudo resistance circuit 40 as described above, the gate voltage of the second field effect transistor Mb is changed and stabilized to equalize or substantially equalize the drain voltage of the second field effect transistor Mb and the voltage of the other end portion of the reference resistance element Rstd and to maintain the drain voltage of the first field effect transistor Ma and the drain voltage of the drain terminal D of the second field effect transistor Mb to be equal or substantially equal to each other; then, the gate voltage of the first field effect transistor Ma and the gate voltage of the second field effect transistor Mb are equal or substantially equal to each other, thereby maintaining the pseudo resistance of the first field effect transistor Ma to be stable at or substantially at the predetermined value.

Next, the features and operation of a charge detection circuit 400 including the pseudo resistance circuit 40 are described below with reference to FIG. 9.

FIG. 9 is a circuit diagram illustrating a charge detection circuit including the pseudo resistance circuit of the fourth specific example.

As shown in FIG. 9, the charge detection circuit 400 includes, similar to the charge detection circuit 100 shown in FIG. 3, the pseudo resistance circuit 40, the third operational amplifier OP3, and the capacitor Cf.

The non-inverting input terminal (+) of the third operational amplifier OP3 is electrically connected to a reference voltage terminal, for example, a ground terminal. The inverting input terminal (−) of the third operational amplifier OP3 is electrically connected to the source terminal S of the first field effect transistor Ma. The output terminal of the third operational amplifier OP3 is electrically connected to the drain terminal D of the first field effect transistor Ma. The capacitor Cf is electrically connected in parallel between the output terminal of the third operational amplifier OP3 and the inverting input terminal (−) thereof as well as between the source terminal S of the first field effect transistor Ma and the drain terminal D thereof.

In the charge detection circuit 400 as described above, a detection signal from a charge output sensor (not shown) is input to the inverting input terminal (−) of the third operational amplifier OP3, and the detection signal is output as an amplified signal.

According to the pseudo resistance circuit 40, because the pseudo resistance of the first field effect transistor Ma is stable at or substantially at a predetermined value, waveform distortion caused by the nonlinearity of the pseudo resistance is reduced in the output signal of the charge detection circuit 400 output from the output terminal of the third operational amplifier OP3. In addition, because the pseudo resistance of the first field effect transistor Ma is able to be relatively high, a detection signal in a low frequency region from the charge output sensor is also amplified in the third operational amplifier OP3 with certainty and output from the charge detection circuit 400. Moreover, in the charge detection circuit 400 including the above-described pseudo resistance circuit 40, circuit integration is able to be easily implemented.

Next, a fifth specific example of the pseudo resistance circuit 1 shown in FIG. 1 and a charge detection circuit including the pseudo resistance circuit are described below.

Figure 10:
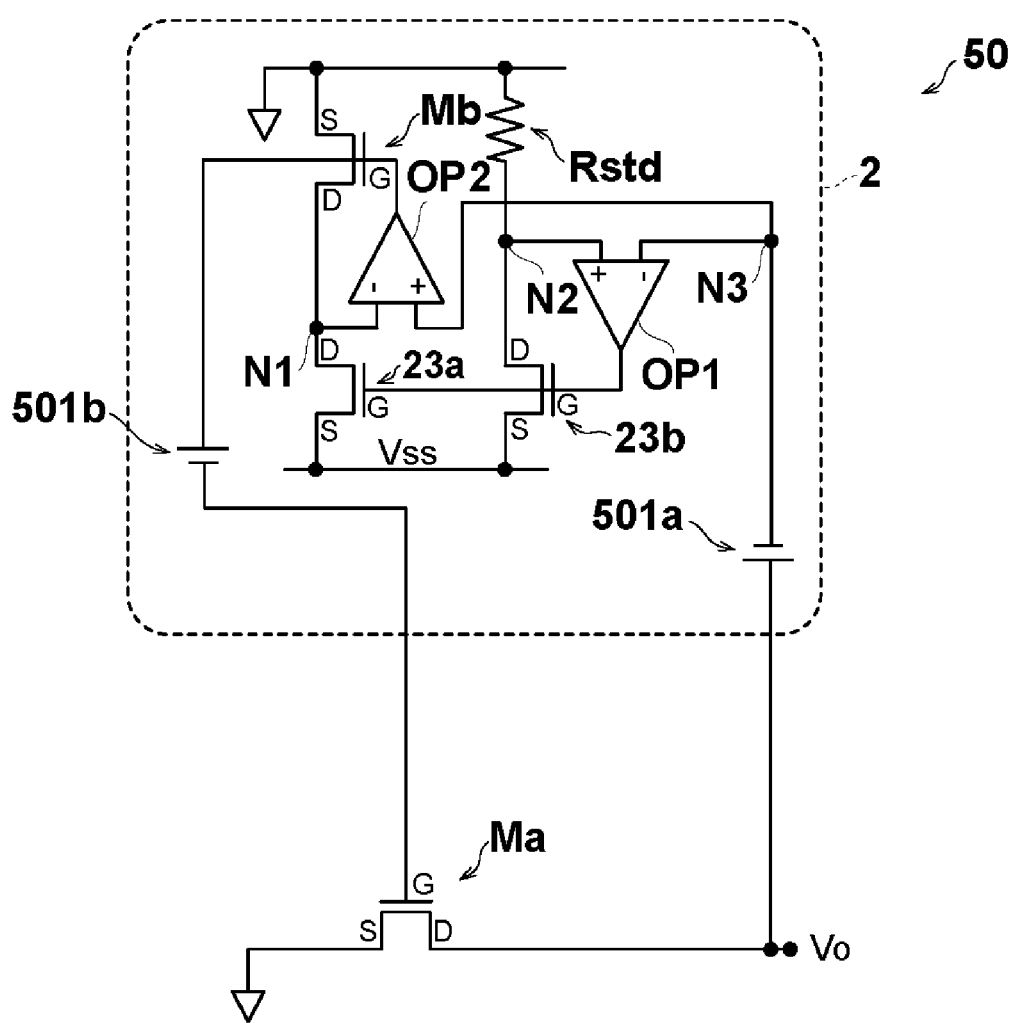
FIG. 10 is a circuit diagram illustrating a fifth specific example of the pseudo resistance circuit shown in FIG. 1.
Figure 11:
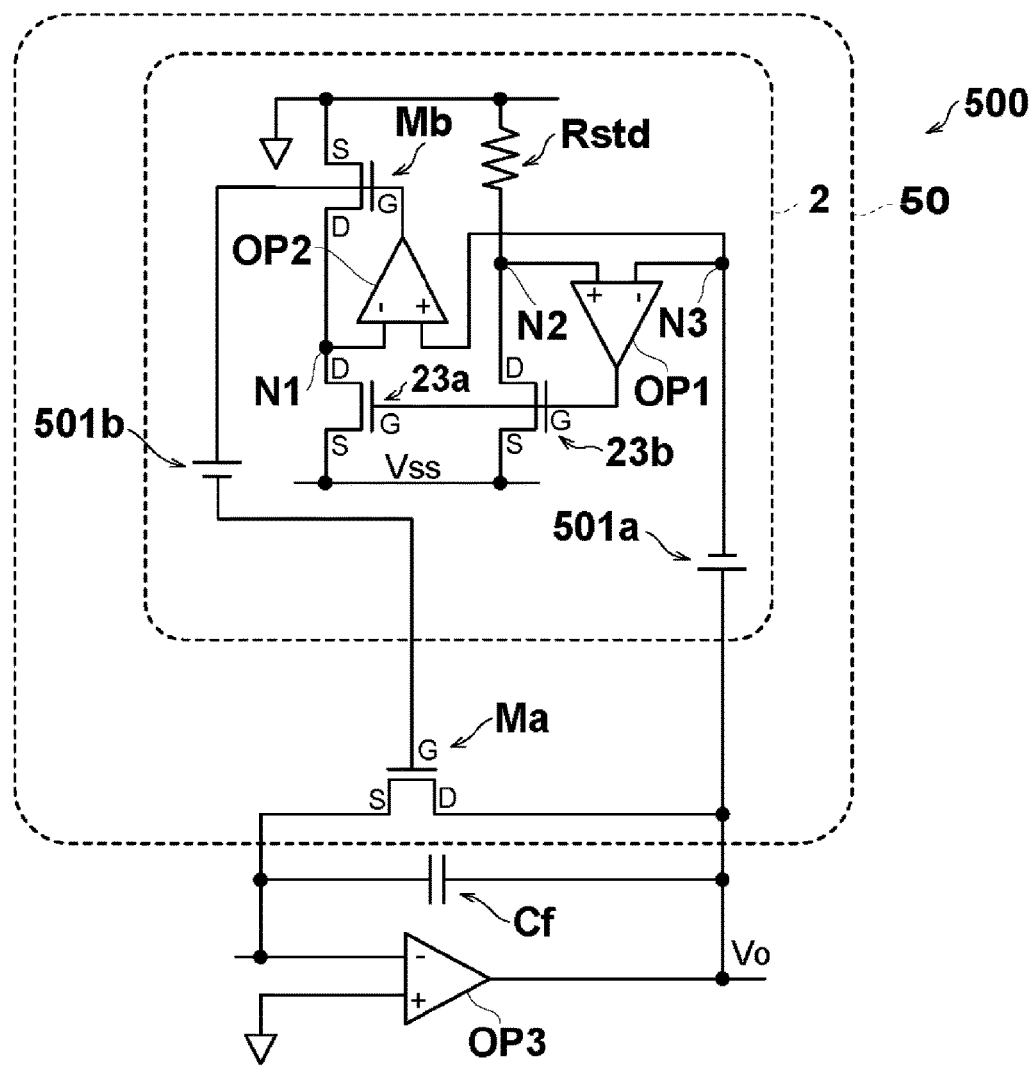
FIG. 11 is a circuit diagram illustrating a charge detection circuit including the fifth specific example of the pseudo resistance circuit shown in FIG. 10.

FIG. 10 is a circuit diagram illustrating a pseudo resistance circuit of the fifth specific example. FIG. 11 is a circuit diagram illustrating a charge detection circuit including the pseudo resistance circuit of the fifth specific example.

As shown in FIGS. 10 and 11, a pseudo resistance circuit 50 and a charge detection circuit 500 of the fifth specific example differs from the pseudo resistance circuit and the charge detection circuit in FIGS. 8 and 9 primarily in that a DC voltage source 501a of a predetermined voltage is included as an element of the first gate voltage adjustment circuit 21 in the electric wiring connecting the drain terminal D of the first field effect transistor Ma and the inverting input terminal (−) of the first operational amplifier OP1 shown in FIGS. 8 and 9, and a DC voltage source 501b of a predetermined voltage is included as an element of the second gate voltage adjustment circuit 22 in the electric wiring connecting the gate terminal G of the first field effect transistor Ma and the gate terminal G of the second field effect transistor Mb shown in FIGS. 8 and 9. Other elements are the same as or similar to those in FIGS. 8 and 9. In the fifth specific example, description is provided focusing on the different points discussed above, and the same reference signs are assigned to identical or similar elements and description thereof is simplified or omitted.

The features and operation of the pseudo resistance circuit 50 of the fifth specific example are described below with reference to FIG. 10.

As shown in FIG. 10, according to the pseudo resistance circuit 50 of the fifth specific example, the DC voltage source 501a of a predetermined voltage is provided in the electric wiring connecting the drain terminal D of the first field effect transistor and the inverting input terminal (−) of the first operational amplifier OP1, and the DC voltage source 501b of a predetermined voltage is provided in the electric wiring connecting the gate terminal G of the first field effect transistor Ma and the gate terminal G of the second field effect transistor Mb.

Specifically, a negative electrode terminal of the DC voltage source 501a is electrically connected to the inverting input terminal (−) of the first operational amplifier OP1, and a positive electrode terminal of the DC voltage source 501a is electrically connected to the drain terminal D of the first field effect transistor Ma. A negative electrode terminal of the DC voltage source 501b is electrically connected to the gate terminal G of the first field effect transistor Ma, and a positive electrode terminal of the DC voltage source 501b is electrically connected to the gate terminal G of the second field effect transistor Mb.

The DC voltage source 501a is provided in the pseudo resistance circuit 50 for at least the reasons discussed below.

If the drain voltage Vo of the first field effect transistor Ma does not include an assumed negative voltage but, instead, includes a positive voltage, the output voltage of the first operational amplifier OP1 drops, and the pseudo resistance circuit 50 attempts to increase the voltage of the node N2 by decreasing the current of the second current source 23b following the drop in the output voltage of the amplifier. However, the potential of the node N2 is raised only to the reference voltage. As a result, a state is reached where the negative feedback operation of the second operational amplifier OP2 cannot be performed.

In the pseudo resistance circuit 50, by providing the DC voltage source 501a, even if the drain voltage Vo of the first field effect transistor Ma includes a negative value, a voltage of a negative value similar to that in the fourth specific example is able to be supplied to the inverting input terminal (−) of the first operational amplifier OP1. Following this, the drain voltage of the drain terminal D of the second field effect transistor Mb becomes lower than the drain voltage of the first field effect transistor Ma. A voltage value Voff of the DC voltage source 501a is preferably set to a positive value greater than the maximum value Vmax of the amplitude of the drain voltage Vo of the first field effect transistor Ma (Voff>Vmax).

Further, in the pseudo resistance circuit 50, by providing the above-described DC voltage source 501b, the gate voltage of the first field effect transistor Ma is able to be so adjusted as to be lower than the gate voltage of the second field effect transistor Mb according to the voltage of the DC voltage source, and the pseudo resistance of the first field effect transistor Ma is adjustable toward a higher value.

As a result, in the pseudo resistance circuit 50, by providing the DC voltage sources 501a and 501b as discussed above, similar to the pseudo resistance circuit 40 of the fourth specific example, the pseudo resistance of the first field effect transistor Ma is stably maintained at or substantially at a predetermined value; and even if the drain voltage Vo of the first field effect transistor Ma changes to a positive voltage, the pseudo resistance of the first field effect transistor Ma is adjustable toward a higher value. However, only one of the DC voltage sources 501a and 501b may be included in the pseudo resistance circuit 50.

Next, the features and operation of the charge detection circuit 500 including the pseudo resistance circuit 50 are described below with reference to FIG. 11.

As shown in FIG. 11, the charge detection circuit 500 of the fifth specific example includes, in addition to the pseudo resistance circuit 50, the third operational amplifier OP3 and the capacitor Cf, similar to the charge detection circuit 400 of the fourth specific example.

In the pseudo resistance circuit 50 of the fifth specific example, by providing the DC voltage sources 501a and 501b, similar to the pseudo resistance circuit 40 of the fourth specific example, the pseudo resistance of the first field effect transistor Ma is stably maintained at or substantially at a predetermined value; and even if the drain voltage Vo of the first field effect transistor Ma changes to a positive voltage, the pseudo resistance of the first field effect transistor Ma is adjustable toward a higher value.

Accordingly, in the charge detection circuit 500 of the fifth specific example, waveform distortion caused by the nonlinearity of the pseudo resistance is reduced in the output signal of the charge detection circuit 500 output from the output terminal of the third operational amplifier OP3, similar to the charge detection circuit 400 of the fourth specific example; in addition, a detection signal in a lower frequency region from the charge output sensor is also amplified in the third operational amplifier OP3 with certainty, in comparison with the charge detection circuit 400 of the fourth specific example, and output from the charge detection circuit 500.

Finally, a sixth specific example of the pseudo resistance circuit 1 shown in FIG. 1 and a charge detection circuit including the pseudo resistance circuit are described below.

Figure 12:
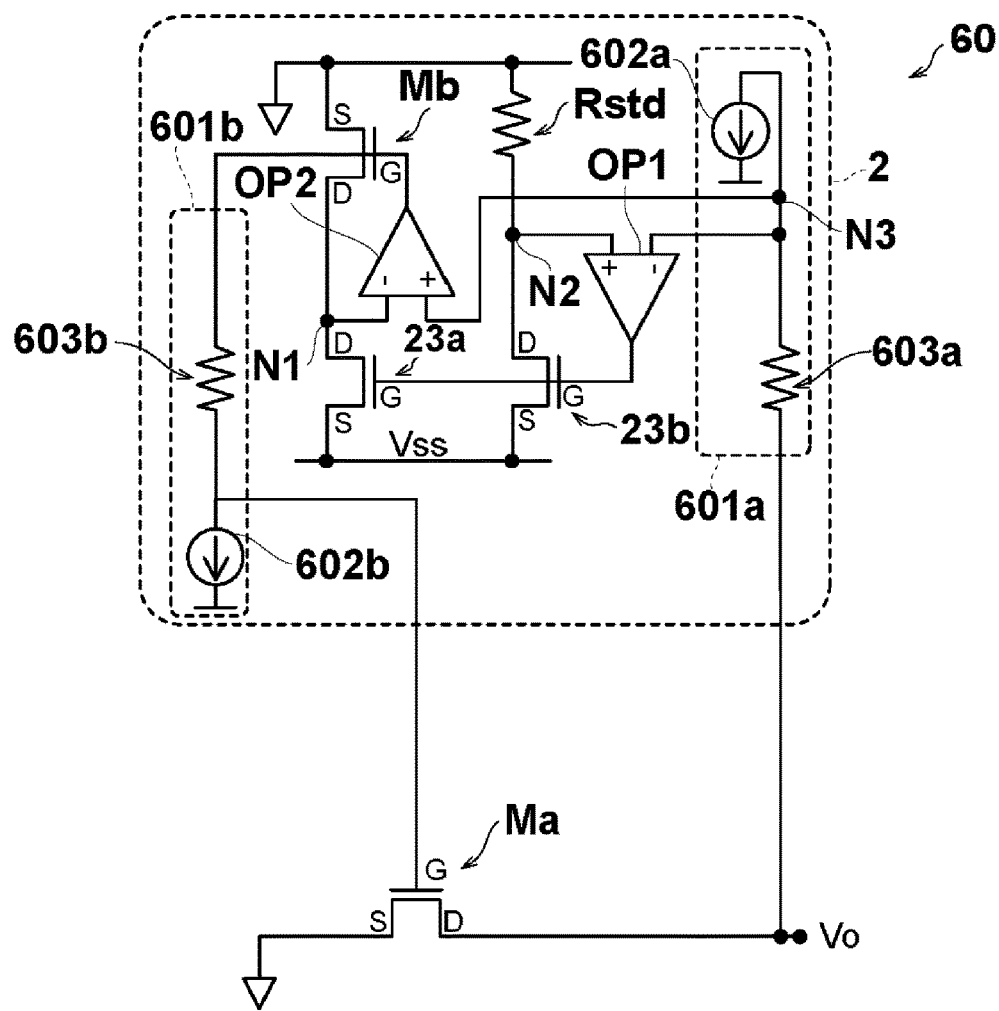
FIG. 12 is a circuit diagram illustrating a sixth specific example of the pseudo resistance circuit shown in FIG. 1.
Figure 13:
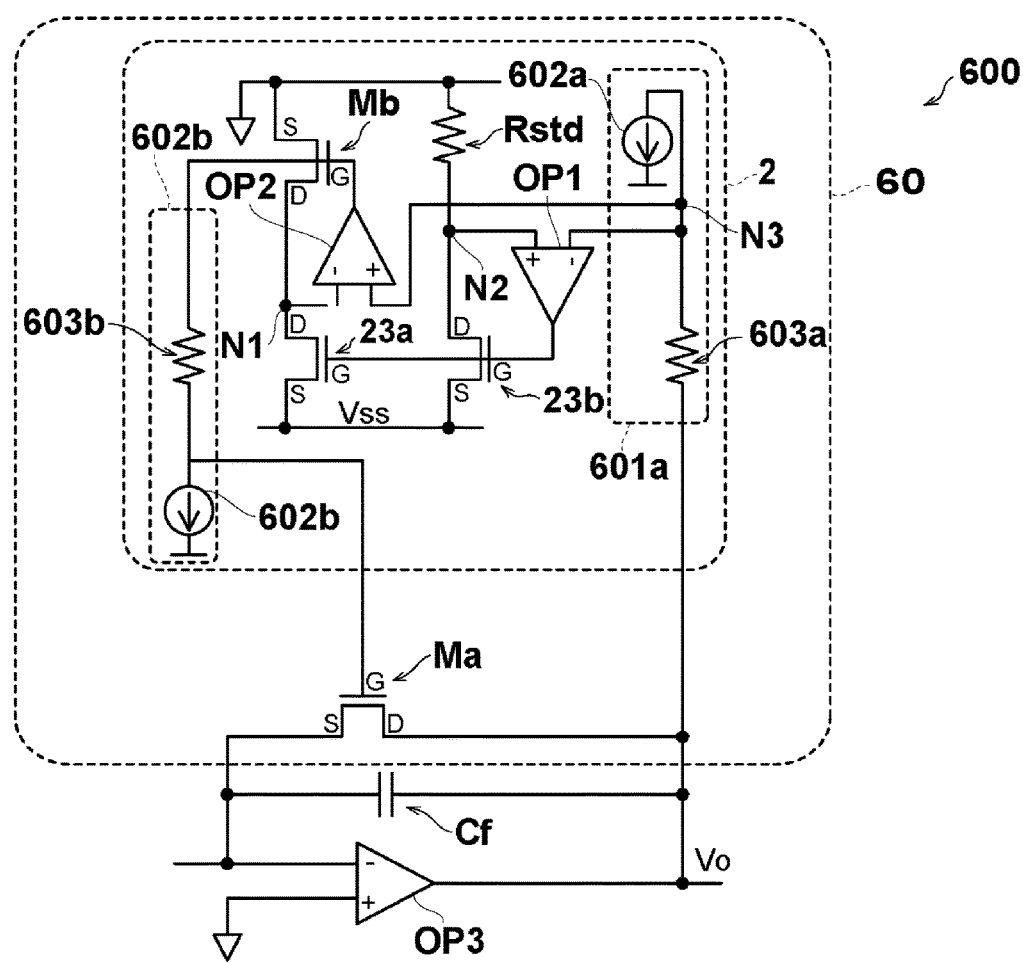
FIG. 13 is a circuit diagram illustrating a charge detection circuit including the sixth specific example of the pseudo resistance circuit shown in FIG. 12.

FIG. 12 is a circuit diagram illustrating a pseudo resistance circuit of the sixth specific example. FIG. 13 is a circuit diagram illustrating a charge detection circuit including the pseudo resistance circuit of the sixth specific example.

As shown in FIGS. 12 and 13, a pseudo resistance circuit 60 and a charge detection circuit 600 of the sixth specific example differ from the pseudo resistance circuit and the charge detection circuit in FIGS. 10 and 11 primarily in that the DC voltage sources 501a and 501b shown in FIGS. 10 and 11 are replaced with floating voltage sources 601a and 601b, respectively. Other elements are the same as or similar to those shown in FIGS. 10 and 11. In the sixth specific example, description is provided focusing on the different points discussed above, and the same reference signs are assigned to identical or similar elements and description thereof is simplified or omitted.

First, the features and operation of the pseudo resistance circuit 60 of the sixth specific example are described below with reference to FIG. 12.

As shown in FIG. 12, the pseudo resistance circuit 60 of the sixth specific example includes, instead of the DC voltage sources 501a and 501b in the pseudo resistance circuit 50 of the fifth specific example, the floating voltage sources 601a and 601b including a PTAT current source 602a and a resistance element 603a, and a PTAT current source 602b and a resistance element 603b, respectively. A voltage value Voff of the floating voltage 601a is preferably set to a positive value greater than the maximum value Vmax of the amplitude of the drain voltage Vo of the first field effect transistor Ma (Voff>Vmax), similar to the DC voltage source 501a of the fifth specific example.

More specifically, one terminal of the PTAT current source 602a is electrically connected to the inverting input terminal (−) of the first operational amplifier OP1 and one end portion of the resistance element 603a, and the other terminal of the PTAT current source 602a is electrically connected to a reference voltage terminal, for example, a ground terminal, that supplies a reference voltage. Further, the one end portion of the resistance element 603a is electrically connected to a negative electrode terminal of the PTAT current source 602a and the inverting input terminal (−) of the first operational amplifier OP1, while the other end portion of the resistance element 603a is electrically connected to the drain terminal D of the first field effect transistor Ma.

One terminal of the PTAT current source 602b is electrically connected to the gate terminal G of the first field effect transistor Ma and one end portion of the resistance element 603b, while the other terminal of the PTAT current source 602b is electrically connected to a reference voltage terminal, for example, a ground terminal, that supplies a reference voltage. Further, the one end portion of the resistance element 603b is electrically connected to the one terminal of the PTAT current source 602b and the gate terminal G of the first field effect transistor Ma, while the other end portion of the resistance element 603b is electrically connected to the gate terminal G of the second field effect transistor Mb.

In the pseudo resistance circuit 60 of the sixth specific example, by providing the above-described floating voltage sources 601a and 601b, the gate voltage of the first field effect transistor Ma is able to be adjusted according to the output voltages that are proportional to the temperatures, and the pseudo resistance of the first field effect transistor Ma is so adjustable as to offset or substantially offset the temperature dependence of the pseudo resistance of the first field effect transistor Ma.

As a result, in the pseudo resistance circuit 60, by providing the floating voltage sources 601a and 601b as discussed above, even if the drain voltage Vo of the first field effect transistor Ma changes to a positive voltage, similar to the pseudo resistance circuit 50 of the fifth specific example, the pseudo resistance of the first field effect transistor Ma is adjustable toward a higher value or the like, and further, by providing the floating voltage sources 601a and 601b, the pseudo resistance of the first field effect transistor Ma is adjustable and offsets or substantially offsets the temperature dependence of the pseudo resistance of the first field effect transistor Ma, thereby reducing the overall temperature dependence.

Next, the features and operation of the charge detection circuit 600 including the pseudo resistance circuit 60 are described below with reference to FIG. 13.

As shown in FIG. 13, the charge detection circuit 600 of the sixth specific example includes, in addition to the pseudo resistance circuit 60, the third operational amplifier OP3 and the capacitor Cf, similar to the charge detection circuit 500 of the fifth specific example.

In the pseudo resistance circuit 60, by providing the floating voltage sources 601a and 601b, even if the drain voltage Vo of the first field effect transistor Ma changes to a positive voltage, similar to the pseudo resistance circuit 50 of the fifth specific example, the pseudo resistance of the first field effect transistor Ma is adjustable toward a higher value or the like, and, by providing the floating voltage sources 601a and 601b, the pseudo resistance of the first field effect transistor Ma is adjustable and offsets or substantially offsets the temperature dependence of the pseudo resistance of the first field effect transistor Ma, thereby reducing the overall temperature dependence.

Accordingly, in the charge detection circuit 600, similar to the charge detection circuit 500 of the fifth specific example, even if the drain voltage Vo of the first field effect transistor Ma changes to a positive voltage, an output signal of the charge detection circuit 600 output from the output terminal of the third operational amplifier OP3 is generated, and a detection signal in a lower frequency region from the charge output sensor is amplified in the third operational amplifier OP3 with certainty and output in a mode in which waveform distortion caused by the nonlinearity of the pseudo resistance is reduced, and further the temperature dependence thereof is reduced in comparison with the charge detection circuit 500 of the fifth specific example.

In theسixth specific example, one of the DC voltage sources 501a and 501b in the pseudo resistance circuit 50 of the fifth specific example may be replaced with the corresponding floating voltage source 601a or 601b.

In the above-described specific examples, although both of the first field effect transistor Ma and the second field effect transistor Mb are shown and described as n-type MOSFETs, they may instead be p-type MOSFETs, because the features and elements of the specific examples are able to be applied regardless of the carrier types of MOSFETs. Electrical-connection destinations of the inverting input terminal and non-inverting input terminal of the first operational amplifier OP1 may be switched to provide negative feedback through the first operational amplifier OP1.

Further, in the above-described specific examples, although the first field effect transistor Ma and the second field effect transistor Mb are shown and described as MOSFETs, field effect transistors other than MOSFETs may be included if they provide electrical characteristics equivalent to the characteristics observed in the weak inversion region.

As discussed above, preferred embodiments and specific examples of the present invention provide a pseudo resistance circuit and a charge detection circuit including the pseudo resistance circuit, in which it is not necessary to include an additional adjustment circuit that adjusts a pseudo resistance of a field effect transistor in accordance with a variation in manufacture processing and changes in power source voltage and temperature, and which reduces waveform distortion due to a change in power source voltage of the field effect transistor. Accordingly, because of the general and versatile features described above, the preferred embodiments and specific examples of the present invention are able to be applied to extensively broad fields, for example, pseudo resistance circuits, charge detection circuits, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A pseudo resistance circuit comprising:
a first current source;
a second current source;
a first field effect transistor that operates in a weak inversion region;
a second field effect transistor including electrical characteristics matched or substantially matched to electrical characteristics of the first field effect transistor, a source terminal electrically connected to a reference voltage terminal, and a drain terminal electrically connected to the first current source;

a reference resistance element including a first end portion electrically connected to the reference voltage terminal and a second end portion electrically connected to the second current source;

a first gate voltage adjustment circuit that adjusts a current of the first current source and a current of the second current source and also adjusts a gate voltage of the second field effect transistor, to equalize or substantially equalize a drain voltage of the second field effect transistor and a voltage of the second end portion of the reference resistance element and controls a drain voltage of the first field effect transistor and the drain voltage of the second field effect transistor to maintain a constant or substantially constant relationship with each other; and a second gate voltage adjustment circuit that adjusts a gate voltage of the first field effect transistor to control the gate voltage of the first field effect transistor and the gate voltage of the second field effect transistor to maintain a constant or substantially constant relationship with each other.

2. The pseudo resistance circuit according to claim 1, wherein the first gate voltage adjustment circuit includes a first voltage source that provides a constant or substantially constant potential difference to the drain voltage of the first field effect transistor, the drain voltage of the second field effect transistor, and the voltage of the second end portion of the reference resistance element.

3. The pseudo resistance circuit according to claim 2, wherein the second gate voltage adjustment circuit includes a second voltage source that provides a constant or substantially constant potential difference to the gate voltage of the first field effect transistor and the gate voltage of the second field effect transistor.

4. The pseudo resistance circuit according to claim 3, wherein the first voltage source and the second voltage source are floating voltage sources that each include a PTAT current source and a resistance element.

5. The pseudo resistance circuit according to claim 3, wherein each of the first voltage source and the second voltage source is a DC voltage source.

6. The pseudo resistance circuit according to claim 1, wherein:

the first gate voltage adjustment circuit includes a first operational amplifier and a second operational amplifier;

a voltage adjusted by the first gate voltage adjustment circuit to maintain a constant or substantially constant relationship with the drain voltage of the first field effect transistor and the voltage of the second end terminal of the reference resistance element are respectively input to two input terminals of the first operational amplifier;

an output terminal of the first operational amplifier provides a voltage that controls respective current supply operations of the first current source and the second current source to the first current source and the second current source;

the voltage of the second end terminal of the reference resistance element and the drain voltage of the second field effect transistor are respectively input to two input terminals of the second operational amplifier; and an output terminal of the second operational amplifier provides the gate voltage to the gate terminal of the second field effect transistor.

7. The pseudo resistance circuit according to claim 6, wherein the first current source and the second current source include field effect transistors that are operated in a strong inversion region.

8. The pseudo resistance circuit according to claim 6, wherein a pseudo resistance of the first field effect transistor and a pseudo resistance of the second field effect transistor are increased by a negative feedback of the second operational amplifier.

9. The pseudo resistance circuit according to claim 1, wherein:

the first gate voltage adjustment circuit includes a first operational amplifier and a second operational amplifier;

a voltage adjusted by the first gate voltage adjustment circuit to maintain a constant or substantially constant relationship with the drain voltage of the first field effect transistor and the voltage of the second end terminal of the reference resistance element are respectively input to two input terminals of the first operational amplifier;

an output terminal of the first operational amplifier provides a voltage that controls respective current supply operations of the first current source and the second current source to the first current source and the second current source;

the voltage adjusted by the first gate voltage adjustment circuit to maintains a constant or substantially constant relationship with the drain voltage of the first field effect transistor and the drain voltage of the second field effect transistor are respectively input to two input terminals of the second operational amplifier; and an output terminal of the second operational amplifier provides the gate voltage to the gate terminal of the second field effect transistor.

10. A charge detection circuit comprising:

the pseudo resistance circuit according to claim 1;

a third operational amplifier including an inverting input terminal electrically connected to the source terminal of the first field effect transistor, a non-inverting input terminal electrically connected to a reference voltage, and an output terminal electrically connected to the drain terminal of the first field effect transistor; and a capacitor electrically connected between the inverting input terminal of the third operational amplifier and the output terminal of the third operational amplifier and between the source terminal of the first field effect transistor and the drain terminal of the first field effect transistor.

11. The pseudo resistance circuit according to claim 1, wherein the first field effect transistor and the second field effect transistor include the same polarity.

12. The pseudo resistance circuit according to claim 1, wherein each of the first field effect transistor and the second field effect transistor is a MOSFET (Metal-Oxide-Semiconductor Field-Effect Transistor).

13. The pseudo resistance circuit according to claim 1, wherein the reference voltage terminal is a ground terminal.

14. The pseudo resistance circuit according to claim 1, wherein the first gate voltage adjustment circuit controls drain voltage of the first field effect transistor and the drain voltage of the second field effect transistor to be equal or substantially equal to each other.

15. The pseudo resistance circuit according to claim 1, wherein the second gate voltage adjustment circuit controls the gate voltage of the first field effect transistor and the gate voltage of the second field effect transistor to be equal or substantially equal to each other.

* * * * *